US012751142B2

(12) United States Patent
Jang et al.

(10) Patent No.: US 12,751,142 B2
(45) Date of Patent: Sep. 29, 2026

(54) DISPLAY DEVICE

(71) Applicants: Samsung Display Co., Ltd., Yongin-si (KR); University-Industry Cooperation Group of Kyung Hee University, Yongin-si (KR)

(72) Inventors: Jin Jang, Seoul (KR); Keun Woo Kim, Yongin-si (KR); Jin Baek Bae, Seoul (KR); Ji Yeong Shin, Yongin-si (KR); Sang Gun Choi, Yongin-si (KR)

(73) Assignees: Samsung Display Co., Ltd., Yongin-si (KR); University-Industry Cooperation Group of Kyung Hee University, Yongin-si (KR)

( * ) Notice: Subject to any disclaimer, the term of this patent is extended or adjusted under 35 U.S.C. 154(b) by 0 days.

(21) Appl. No.: 19/175,884

(22) Filed: Apr. 10, 2025

(65) Prior Publication Data

US 2026/0068434 A1 Mar. 5, 2026

(30) Foreign Application Priority Data

Sep. 5, 2024 (KR) ........................ 10-2024-0120903

(51) Int. Cl.
*G09G 3/3233* (2016.01)
*G09G 3/3266* (2016.01)
(Continued)

(52) U.S. Cl.
CPC ....... *H10K 59/1213* (2023.02); *G09G 3/3233* (2013.01); *G09G 3/3266* (2013.01);
(Continued)

(58) Field of Classification Search
CPC ..... G09F 9/301; G09G 3/3266; G09G 3/3677
See application file for complete search history.

(56) References Cited

U.S. PATENT DOCUMENTS 9,634,272 B2 * 4/2017 Choi .................... H10K 10/481
10,127,848 B2 * 11/2018 Kang ....................... G09G 3/03
(Continued)

FOREIGN PATENT DOCUMENTS

| | | | |
|---|---|---|---|
| CN | 108154846 | B | 4/2022 |
| KR | 10-2017-0013755 | A | 2/2017 |
| KR | 10-2566551 | B1 | 8/2023 |

OTHER PUBLICATIONS

Yu-Xuan Wang et al.; A Novel Structural Design Serving as a Stress Relief Layer for Flexible LTPS TFTs; Downloaded Mar. 18, 2025; 4 pages.

*Primary Examiner* — Sepehr Azari
(74) *Attorney, Agent, or Firm* — Womble Bond Dickinson (US) LLP

(57) ABSTRACT

A display device includes non-folding areas, at least one folding area between the non-folding areas and configured to be transformed into a bent shape and a planar shape, and a display panel emitting light for displaying an image. A circuit layer of the display panel includes light-emitting pixel drivers, gate lines, and a gate-driving circuit including stages electrically connected to the gate lines. Each of the stages includes a first buffer transistor and a second buffer transistor. A channel portion of each of the first buffer transistor and the second buffer transistor in the at least one folding area has a comb shape formed by one or more slits that extend in a direction in which the first electrode portion and the second electrode portion face each other and are arranged in parallel with each other.

20 Claims, 28 Drawing Sheets

(51) Int. Cl.

| | |
|---|---|
| ***H10K 59/121*** | (2023.01) |
| ***H10K 59/131*** | (2023.01) |
| ***H10K 59/80*** | (2023.01) |
| *H10K 102/00* | (2023.01) |

(52) U.S. Cl.

CPC ......... *H10K 59/131* (2023.02); *H10K 59/873* (2023.02); *G09G 2300/0426* (2013.01); *G09G 2300/0819* (2013.01); *G09G 2300/0842* (2013.01); *H10K 2102/311* (2023.02)

(56) References Cited

U.S. PATENT DOCUMENTS

| | | | | |
|---|---|---|---|---|
| 10,482,817 | B2 | 11/2019 | Kim et al. | |
| 10,879,334 | B2 * | 12/2020 | Lee | H10K 59/131 |
| 12,265,421 | B2 * | 4/2025 | Lee | G06F 1/1616 |
| 2015/0287365 | A1 * | 10/2015 | Song | G09G 3/20<br>345/82 |
| 2016/0225836 | A1 * | 8/2016 | Choi | H10K 77/111 |
| 2019/0228697 | A1 * | 7/2019 | Zeng | G09G 3/20 |
| 2024/0147638 | A1 * | 5/2024 | Kim | H05K 5/02 |

* cited by examiner

GL: GWL, GCL, GIL, ECL, GBL

SEL1: CH1, E11, E21, CH2, E12, E22, CH6, E16, E26
GCDL1: G1, G2, G6
GCDL2: CAE, LB2
SEL2: CH4, E14, E24
GCDL3: G4
SDCDL1: ANCE1, DCE, GCNE
SDCDL2: ANCE2, DL, VDL

DISPLAY DEVICE

CROSS-REFERENCE TO RELATED APPLICATION

This application claims priority to, and the benefit of, Korean Patent Application No. 10-2024-0120903 filed on Sep. 5, 2024, in the Korean Intellectual Property Office, the contents of which in its entirety are incorporated herein by reference.

BACKGROUND

1. Field

The present disclosure relates to a display device.

2. Description of the Related Art

With the advance of information-oriented society, more and more demands are placed on display devices for displaying images in various ways. For example, display devices are employed in various electronic devices, such as smartphones, digital cameras, laptop computers, navigation devices, and smart televisions.

The display device may be a flat panel display device, such as a liquid crystal display device, a field emission display device and a light-emitting display device. Examples of the light-emitting display device may include an organic light-emitting display device including organic light-emitting elements, an inorganic light-emitting display device including inorganic light-emitting elements, such as inorganic semiconductors, and a micro light-emitting display device including micro light-emitting elements.

The organic light-emitting display device displays an image using light-emitting elements, each including a light-emitting layer made of an organic light-emitting material. As described above, the organic light-emitting display device implements image display using a self-emitting element, and thus may have relatively superior performance in power consumption, response speed, luminous efficiency, luminance, and wide viewing angle compared to other display devices.

In the display device, a display surface from which light is emitted may include a display area in which an image is displayed, and a non-display area around the display area. Emission areas emitting light with respective luminances and colors may be arranged in the display area.

SUMMARY

A display device may include a plurality of non-folding areas maintaining a planar shape, at least one folding area located between the non-folding areas and able to be transformed into a bent shape and the planar shape, and a display panel for emitting light for displaying an image.

In this case, bending stress due to a bent shape and shape transformation may be repeatedly applied to at least one folding area, so that damage or breakage of some transistors overlapping at least one folding area may occur. For example, as in the case of buffer transistors and electrodes electrically connected thereto of a gate-driving circuit embedded into a display panel, as they might have a relatively wide width, they may become more vulnerable to bending stress.

As a result, there is a problem that the lifespan of a display device including a plurality of non-folding areas and at least one folding area may be reduced.

In view of the foregoing, aspects of the present disclosure provide a display device having an improved lifespan by forming at least some of buffer transistors and electrodes of a gate-driving circuit to have a shape in which damage due to bending stress may be reduced, although a plurality of non-folding areas and at least one folding area are included.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a display device including a display panel configured to emit light for displaying an image, and including non-folding areas for maintaining a planar shape, at least one folding area between the non-folding areas, and configured to be transformed between a bent shape and a planar shape, a substrate including a display area in which emission areas are arranged, and a non-display area around the display area, an element layer including light-emitting elements in the emission areas, and a circuit layer between the element layer and the substrate, and including light-emitting pixel drivers respectively electrically connected to the light-emitting elements, gate lines for transmitting gate signals to the light-emitting pixel drivers, and a gate-driving circuit including stages electrically connected to the gate lines and including a first buffer transistor and a second buffer transistor connected in series between a first gate level voltage line and a second gate level voltage line, wherein the first buffer transistor and the second buffer transistor include a channel portion, a first electrode portion connected to one side of the channel portion, a second electrode portion connected to another side of the channel portion, and a gate electrode overlapping the channel portion above an insulating layer covering the channel portion, and wherein the channel portion in the at least one folding area has a comb shape of one or more slits extending in parallel in a direction in which the first electrode portion and the second electrode portion face each other.

The channel portion in the at least one folding area may include two or more splits at respective sides of the one or more slits, wherein a width of the two or more splits is greater than a width of the one or more slits.

The stages may further include a first buffer input electrode electrically connected to the first gate level voltage line and to the first electrode portion of the first buffer transistor, a second buffer input electrode electrically connected to the second gate level voltage line and to the first electrode portion of the second buffer transistor, and a buffer output electrode electrically connected between at least one of the gate lines and the second electrode portion of the first buffer transistor and the second electrode portion of the second buffer transistor, wherein the first buffer input electrode, the second buffer input electrode, and the buffer output electrode in the at least one folding area has a mesh shape of two or more through grooves arranged in parallel.

The channel portion in the non-folding areas may have a planar shape other than the comb shape, wherein the first buffer input electrode, the second buffer input electrode, and the buffer output electrode in the non-folding areas has a planar shape other than the mesh shape.

The channel portion in the non-folding areas may have the comb shape, wherein the first buffer input electrode, the second buffer input electrode, and the buffer output electrode in the non-folding areas has the mesh shape.

The circuit layer may further include a first semiconductor layer above the substrate, a first gate-insulating layer covering the first semiconductor layer, a first gate conductive layer above the first gate-insulating layer, a second gate-insulating layer covering the first gate conductive layer, a second gate conductive layer above the second gate-insulating layer, and a first interlayer insulating layer covering the second gate conductive layer, wherein the channel portion, the first electrode portion, and the second electrode portion are in the first semiconductor layer, and wherein the gate electrode is in the first gate conductive layer.

The circuit layer may further include a second semiconductor layer above the first interlayer insulating layer, a third gate-insulating layer covering the second semiconductor layer, a third gate conductive layer above the third gate-insulating layer, a second interlayer insulating layer covering the third gate conductive layer, a first source-drain conductive layer above the second interlayer insulating layer, a first planarization layer covering the first source-drain conductive layer, a second source-drain conductive layer above the first planarization layer, and a second planarization layer covering the second source-drain conductive layer, wherein the first buffer input electrode, the second buffer input electrode, and the buffer output electrode are in the first source-drain conductive layer or the second source-drain conductive layer.

One of the light-emitting pixel drivers may include a first transistor electrically connected between a first node and a second node, a pixel capacitor electrically connected between a first power line and a third node, a second transistor electrically connected between a data line for transmitting a data signal and the first node, a third transistor electrically connected between the second node and the third node, a fourth transistor electrically connected between a gate initialization voltage line for transmitting a gate initialization voltage and the third node, a fifth transistor electrically connected between the first power line and the first node, a sixth transistor electrically connected between the second node and a fourth node, a seventh transistor electrically connected between an anode initialization voltage line for transmitting an anode initialization voltage and the fourth node, and an eighth transistor electrically connected between a bias voltage line for transmitting a bias voltage and the first node, wherein the first node is electrically connected to a first electrode of the first transistor, wherein the second node is electrically connected to a second electrode of the first transistor, wherein the third node is electrically connected to a gate electrode of the first transistor, wherein the fourth node is electrically connected to one of the light-emitting elements, wherein the first transistor, the second transistor, the fifth transistor, the sixth transistor, the seventh transistor, and the eighth transistor include a channel portion, a first electrode portion, and a second electrode portion in the first semiconductor layer, and wherein the third transistor and the fourth transistor include a channel portion, a first electrode portion, and a second electrode portion in the second semiconductor layer.

The gate lines may include scan write lines for transmitting a scan write signal, scan initialization lines for transmitting a scan initialization signal, gate control lines for transmitting a gate control signal, emission control lines for transmitting an emission control signal, and bias control lines for transmitting a bias control signal, wherein the second transistor is configured to be turned on by the scan write signal, wherein the third transistor is configured to be turned on by the gate control signal, wherein the fourth transistor is configured to be turned on by the scan initialization signal, wherein the fifth transistor and the sixth transistor are configured to be turned on by the emission control signal, and wherein the seventh transistor and the eighth transistor are configured to be turned on by the bias control signal.

A part of the display area may overlap the at least one folding area, wherein a part of the non-display area overlaps the at least one folding area.

The at least one folding area may be configured to be transformed by in-folding or out-folding.

According to an aspect of the present disclosure, there is provided an electronic device including a lower cover, a cover window above the lower cover, and a display device for displaying an image between the lower cover and the cover window, and including a display panel configured to emit light for displaying an image, the display panel including non-folding areas maintaining a planar shape, at least one folding area between the non-folding areas, and configured to transform between a bent shape and a planar shape, a substrate including a display area in which emission areas are arranged, and a non-display area around the display area, an element layer including light-emitting elements in the emission areas above the substrate, and a circuit layer between the element layer and the substrate, and including light-emitting pixel drivers respectively electrically connected to the light-emitting elements, gate lines for transmitting gate signals to the light-emitting pixel drivers, and a gate-driving circuit including stages electrically connected to the gate lines, the stages including a first buffer transistor and a second buffer transistor connected in series between a first gate level voltage line and a second gate level voltage line, a first buffer input electrode electrically connected to the first gate level voltage line and a first electrode portion of the first buffer transistor, a second buffer input electrode electrically connected to the second gate level voltage line and a first electrode portion of the second buffer transistor, and a buffer output electrode electrically connected between at least one of the gate lines and a second electrode portion of the first buffer transistor and a second electrode portion of the second buffer transistor, wherein the gate lines are electrically connected to the buffer output electrodes, and wherein the first buffer input electrode, the second buffer input electrode, and the buffer output electrode in the at least one folding area has a mesh shape of two or more through grooves arranged in parallel.

The first buffer transistor and the second buffer transistor may include a channel portion, a first electrode portion connected to one side of the channel portion, a second electrode portion connected to another side of the channel portion, and a gate electrode overlapping the channel portion above an insulating layer covering the channel portion, wherein the channel portion of the first buffer transistor and the second buffer transistor in the at least one folding area has a comb shape of one or more slits extending in parallel in a direction in which the first electrode portion and the second electrode portion face each other.

The channel portion in the at least one folding area may include two or more splits at respective sides of the one or more slits, wherein a width of the two or more splits is greater than a width of the one or more slits.

The channel portion in the non-folding areas may have a planar shape other than the comb shape, wherein the first buffer input electrode, the second buffer input electrode, and the buffer output electrode in the non-folding areas has a planar shape other than the mesh shape.

The channel portion in the non-folding areas may have the comb shape, wherein the first buffer input electrode, the second buffer input electrode, and the buffer output electrode in the non-folding areas has the mesh shape.

The circuit layer may further include a first semiconductor layer above the substrate, a first gate-insulating layer covering the first semiconductor layer, a first gate conductive layer above the first gate-insulating layer, a second gate-insulating layer covering the first gate conductive layer, a second gate conductive layer above the second gate-insulating layer, a first interlayer insulating layer covering the second gate conductive layer, a second semiconductor layer above the first interlayer insulating layer, a third gate-insulating layer covering the second semiconductor layer, a third gate conductive layer above the third gate-insulating layer, a second interlayer insulating layer covering the third gate conductive layer, a first source-drain conductive layer above the second interlayer insulating layer, a first planarization layer covering the first source-drain conductive layer, a second source-drain conductive layer above the first planarization layer, and a second planarization layer covering the second source-drain conductive layer, wherein the first buffer input electrode, the second buffer input electrode, and the buffer output electrode are in the first source-drain conductive layer or the second source-drain conductive layer.

The gate electrode may be in the first gate conductive layer.

The gate lines may include scan write lines for transmitting a scan write signal, scan initialization lines for transmitting a scan initialization signal, gate control lines for transmitting a gate control signal, emission control lines for transmitting an emission control signal, and bias control lines for transmitting a bias control signal.

One of the light-emitting pixel drivers may include a first transistor electrically connected between a first node and a second node, a pixel capacitor electrically connected between a first power line and a third node, a second transistor electrically connected between a data line for transmitting a data signal and the first node, a third transistor electrically connected between the second node and the third node, a fourth transistor electrically connected between a gate initialization voltage line for transmitting a gate initialization voltage and the third node, a fifth transistor electrically connected between the first power line and the first node, a sixth transistor electrically connected between the second node and a fourth node, a seventh transistor electrically connected between an anode initialization voltage line for transmitting an anode initialization voltage and the fourth node, and an eighth transistor electrically connected between a bias voltage line for transmitting a bias voltage and the first node, wherein the first node is electrically connected to a first electrode of the first transistor, wherein the second node is electrically connected to a second electrode of the first transistor, wherein the third node is electrically connected to a gate electrode of the first transistor, wherein the fourth node is electrically connected to one of the light-emitting elements, wherein the first transistor, the second transistor, the fifth transistor, the sixth transistor, the seventh transistor, and the eighth transistor include a channel portion, a first electrode portion, and a second electrode portion in the first semiconductor layer, wherein the third transistor and the fourth transistor include a channel portion, a first electrode portion, and a second electrode portion in the second semiconductor layer, wherein the second transistor is configured to be turned on by the scan write signal, wherein the third transistor is configured to be turned on by the gate control signal, wherein the fourth transistor is configured to be turned on by the scan initialization signal, wherein the fifth transistor and the sixth transistor are configured to be turned on by the emission control signal, and wherein the seventh transistor and the eighth transistor are configured to be turned on by the bias control signal.

A display device according to embodiments includes a plurality of non-folding areas maintaining a planar shape, at least one folding area located between the plurality of non-folding areas and transformed into a bent shape and the planar shape, and a display panel comprising the plurality of non-folding areas and the at least one folding area and emitting light for displaying an image. The circuit layer of the display panel includes gate lines for transmitting gate signals to light-emitting pixel drivers, and a gate-driving circuit comprising stages electrically connected to the gate lines. Each of the stages includes a first buffer transistor and a second buffer transistor connected in series between a first gate level voltage line and a second gate level voltage line. A channel portion of each of the first buffer transistor and the second buffer transistor located in the at least one folding area may have a comb shape formed by one or more slits that extend in a direction in which a first electrode portion and a second electrode portion face each other and are arranged in parallel with each other.

In this way, a channel portion of each of a first buffer transistor and a second buffer transistor located in at least one folding area may have reduced bending stress due to a comb shape. Accordingly, although bending stress is repeatedly applied to at least one folding area, damage or breakage of the channel portion of each of the first buffer transistor and the second buffer transistor located in at least one folding area may be reduced or delayed. Accordingly, because the period during which the characteristics of the first buffer transistor and the second buffer transistor located in at least one folding area are maintained at a threshold or above is increased, the lifespan of the display device may be improved.

According to embodiments, each of the stages may further include a first buffer input electrode electrically connected to the first electrode portion of the first buffer transistor, a second buffer input electrode electrically connected to the first electrode portion of the second buffer transistor, and a buffer output electrode electrically connected to the second electrode portion of the first buffer transistor and the second electrode portion of the second buffer transistor. Each of the first buffer input electrode, the second buffer input electrode, and the buffer output electrode located in the at least one folding area has a mesh shape formed by two or more through grooves arranged in parallel with each other.

In this way, the bending stress of each of a first buffer input electrode, a second buffer input electrode, and a buffer output electrode located in at least one folding area may be reduced due to a mesh shape. Accordingly, although the bending stress is repeatedly applied to at least one folding area, damage or breakage of each of the first buffer input electrode, the second buffer input electrode, and the buffer output electrode located in at least one folding area may be reduced or delayed. Accordingly, because the period during which the output characteristics of stages located in at least one folding area are maintained at a threshold or above is increased, the lifespan of the display device may be improved.

It should be noted that aspects of the present disclosure are not limited to those described above, and other aspects of the present disclosure will be apparent to those skilled in the art from the following descriptions.

BRIEF DESCRIPTION OF THE DRAWINGS

The above and other aspects of the present disclosure will become more apparent by describing in detail embodiments thereof with reference to the attached drawings, in which.

DETAILED DESCRIPTION

Figure 1:
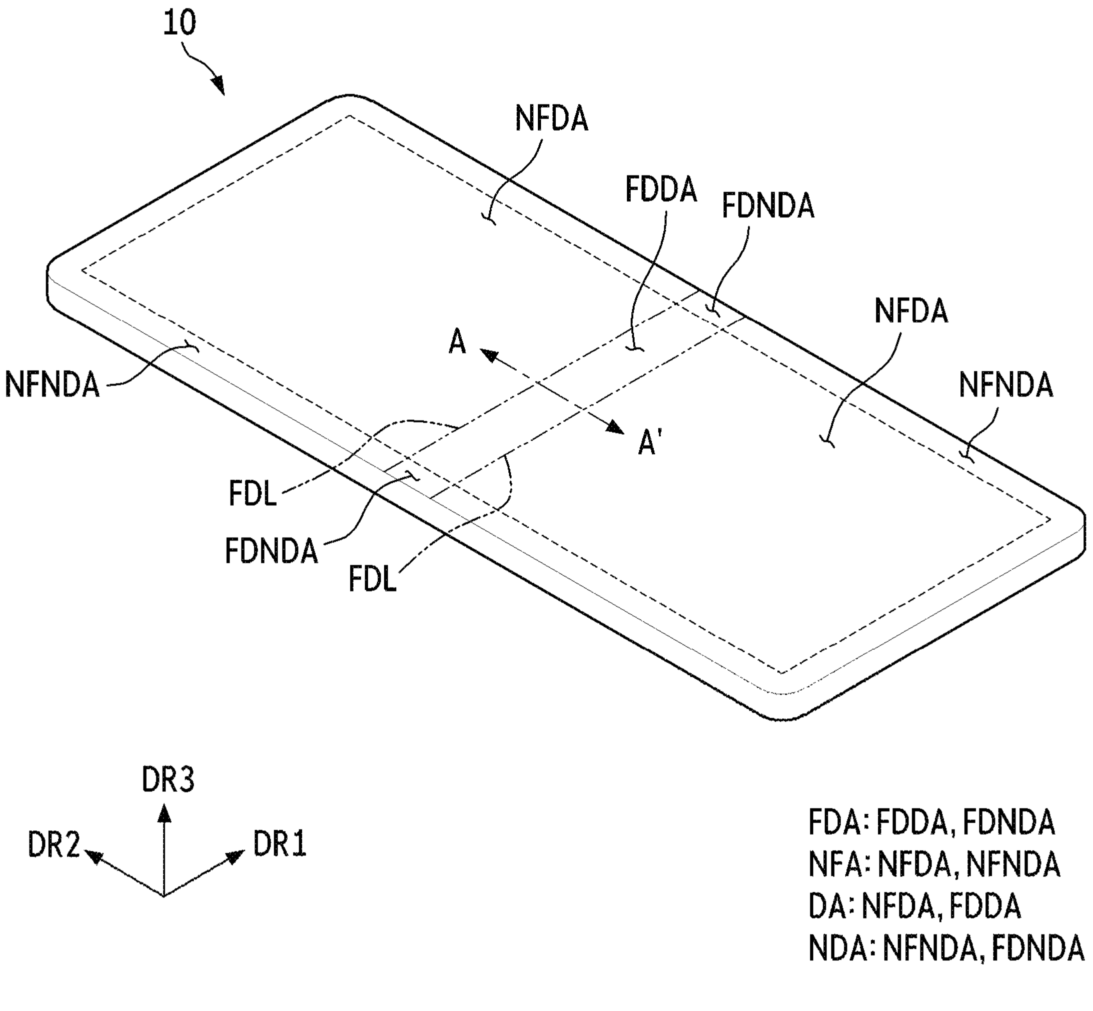
FIGS. 1 and 2 are perspective views showing an unfolded state and a folded state of a display device according to one or more embodiments.

Aspects of some embodiments of the present disclosure and methods of accomplishing the same may be understood more readily by reference to the detailed description of embodiments and the accompanying drawings. The described embodiments are provided as examples so that this disclosure will be thorough and complete, and will fully convey the aspects of the present disclosure to those skilled in the art. Accordingly, processes, elements, and techniques that are redundant, that are unrelated or irrelevant to the description of the embodiments, or that are not necessary to those having ordinary skill in the art for a complete understanding of the aspects of the present disclosure may be omitted. Unless otherwise noted, like reference numerals, characters, or combinations thereof denote like elements throughout the attached drawings and the written description, and thus, repeated descriptions thereof may be omitted.

The described embodiments may have various modifications and may be embodied in different forms, and should not be construed as being limited to only the illustrated embodiments herein. The use of "can," "may," or "may not" in describing an embodiment corresponds to one or more embodiments of the present disclosure.

A person of ordinary skill in the art would appreciate, in view of the present disclosure in its entirety, that each suitable feature of the various embodiments of the present disclosure may be combined or combined with each other, partially or entirely, and may be technically interlocked and operated in various suitable ways, and each embodiment may be implemented independently of each other or in conjunction with each other in any suitable manner unless otherwise stated or implied.

In the drawings, the relative sizes of elements, layers, and regions may be exaggerated for clarity and/or descriptive purposes. In other words, because the sizes and thicknesses of elements in the drawings are arbitrarily illustrated for convenience of description, the disclosure is not limited thereto. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result of, for example, manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of elements, layers, or regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region.

Likewise, a buried region formed by implantation may result in some implantation in the region between the buried region and the surface through which the implantation takes place.

Spatially relative terms, such as "beneath," "below," "lower," "lower side," "under," "above," "upper," "over," "higher," "upper side," "side" (e.g., as in "sidewall"), and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component (e.g., an apparatus, a device, a circuit, a wire, an electrode, a terminal, a conductive film, etc.) is referred to as being "formed on," "on," "connected to," or "(operatively, functionally, or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or one or more intervening layers, regions, or components may be present. The one or more intervening components may include a switch, a transistor, a resistor, an inductor, a capacitor, a diode and/or the like. Accordingly, a connection is not limited to the connections illustrated in the drawings or the detailed description and may also include other types of connections. In describing embodiments, an expression of connection indicates electrical connection unless explicitly described to be direct connection, and "directly connected/directly coupled," or "directly on," refers to one component directly connecting or coupling another component, or being on another component, without an intermediate component.

In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to," may be construed similarly. It will be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," or "one or more of" when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XY, YZ, and XZ, or any variation thereof. Similarly, the expressions "at least one of A and B" and "at least one of A or B" may include A, B, or A and B. As used herein, "or" generally means "and/or," and the term "and/or" includes any and all combinations of one or more of the associated listed items. For example, the expression "A and/or B" may include A, B, or A and B. Similarly, expressions such as "at least one of," "a plurality of," "one of," and other prepositional phrases, when preceding a list of elements, modify the entire list of elements and do not modify the individual elements of the list. When "C to D" is stated, it means C or more and D or less, unless otherwise specified.

It will be understood that, although the terms "first," "second," "third," etc., may be used herein to describe various elements, components, regions, layers and/or sections, these elements, components, regions, layers and/or sections should not be limited by these terms. These terms do not correspond to a particular order, position, or superiority, and are only used to distinguish one element, member, component, region, area, layer, section, or portion from another element, member, component, region, area, layer, section, or portion. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the terms "substantially," "about," "approximately," and similar terms are used as terms of approximation and not as terms of degree, and are intended to account for the inherent deviations in measured or calculated values that would be recognized by those of ordinary skill in the art. For example, "substantially" may include a range of +/−5% of a corresponding value. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure." Furthermore, the expression "being the same" may mean "being substantially the same". In other words, the expression "being the same" may include a range that can be tolerated by those of ordinary skill in the art. The other expressions may also be expressions from which "substantially" has been omitted.

In some embodiments well-known structures and devices may be described in the accompanying drawings in relation to one or more functional blocks (e.g., block diagrams), units, and/or modules to avoid unnecessarily obscuring various embodiments. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interact individual blocks, units, and/or modules without departing from the scope of the present disclosure. In addition, in some embodiments, the block, unit and/or module may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
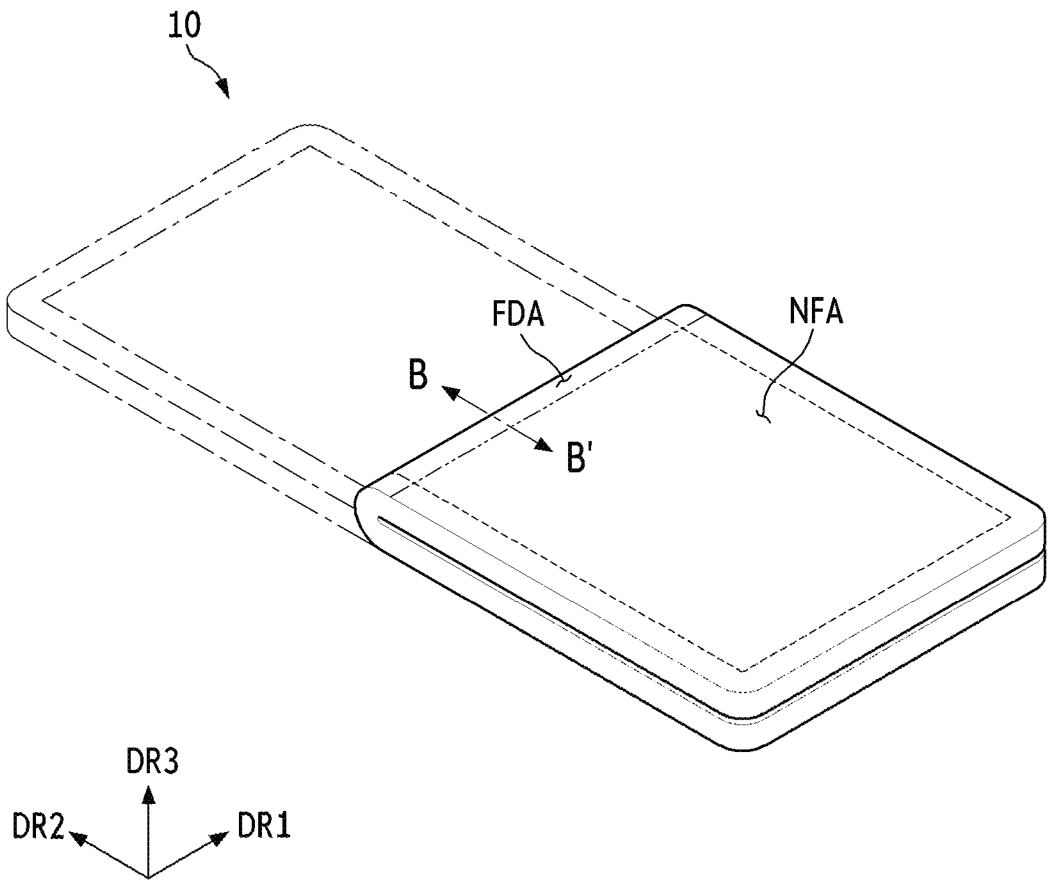

FIGS. 1 and 2 are perspective views showing an unfolded state and a folded state of a display device according to one or more embodiments.

Referring to FIG. 1, a display device 10 according to one or more embodiments may be embedded into an electronic device including a function of displaying a moving image or still image. For example, the display device 10 may be built in a portable electronic device, such as a mobile phone, a smartphone, a tablet personal computer (PC), a mobile communication terminal, an electronic organizer, an electronic book, a portable multimedia player (PMP), a navigation system, an ultra-mobile PC (UMPC) or the like. Alternatively, the display device 10 according to one or more embodiments may be built in an electronic device, such as a television, a laptop, a monitor, a billboard, or an Internet-of-Things (IoT) terminal.

Examples of the display device 10 may include an inorganic light-emitting diode display device, an organic light-emitting display device, a quantum dot light-emitting display device, a plasma display device and a field emission display device. In the following description, a case where the display device 10 is an organic light-emitting diode display device will be exemplified, but the present disclosure is not limited thereto, and other display devices may be applied within the same scope of technical spirit.

The display device 10 may have a shape, such as a rectangular shape elongated in a second direction DR2, a rectangular shape elongated in a first direction DR1, a square shape, a quadrilateral shape with rounded corners (vertices), other polygonal shapes, and a circular shape. The display device 10 may include a display area DA similar to the overall shape of the display device 10. The display device 10 of one or more embodiments illustrated in FIG. 1 includes a rectangular shape having a long length in the second direction DR2.

In the display device 10, one surface located in a plane in the first direction DR1 and the second direction DR2 may be a display surface from which light is emitted. Further, a third direction DR3 may be a thickness direction of the display device 10.

According to one or more embodiments, the display device 10 may be a foldable type including a plurality of non-folding areas NFA that maintain a planar shape, and at least one folding area FDA that is located between the non-folding areas NFA and that is transformed into a bent shape and a planar shape.

As illustrated in FIGS. 1 and 2, the display device 10 according to one or more embodiments may include two non-folding areas NFA facing each other in the second direction DR2 and one folding area FDA located therebetween.

Two folding lines FDL, which are boundaries between each of two non-folding areas NFA and one folding area FDA, may extend in the first direction DR1.

As illustrated in FIG. 1, in the display device 10 in an unfolded state, at least one folding area FDA may have a flat, completely unfolded planar shape in the coordinates of the first direction DR1 and the second direction DR2.

Further, as shown in the illustration of FIG. 2, in the display device 10 in a folded state, at least one folding area FDA may have a folded or bent shape.

The display device 10 may be transformed into an in-folded state in which the display surfaces of the plurality of non-folding areas NFA are located to face each other and are hidden from the outside due to the folding area FDA having a bent shape.

Alternatively, the display device 10 may be transformed into an out-folded state in which the display surfaces of the plurality of non-folding areas NFA overlap each other and are exposed to the outside due to the folding area FDA having a bent shape.

The display surface of the display device 10 may include the display area DA from which light is emitted for displaying an image, and a non-display area NDA located around the display area DA and from which light is not emitted.

The display area DA may include a plurality of non-folding display areas NFDA overlapping the plurality of non-folding areas NFA, and at least one folding display area FDDA overlapping at least one folding area FDA.

The non-display area NDA may include a plurality of non-folding non-display areas NFNDA overlapping the plurality of non-folding areas NFA, and at least one folding non-display area FDNDA overlapping at least one folding area FDA. In other words, each of the plurality of non-folding areas NFA may include the non-folding display area NFDA and the non-folding non-display area NFNDA. Further, at least one folding area FDA may include the folding display area FDDA and the folding non-display area FDNDA.

Figure 3:
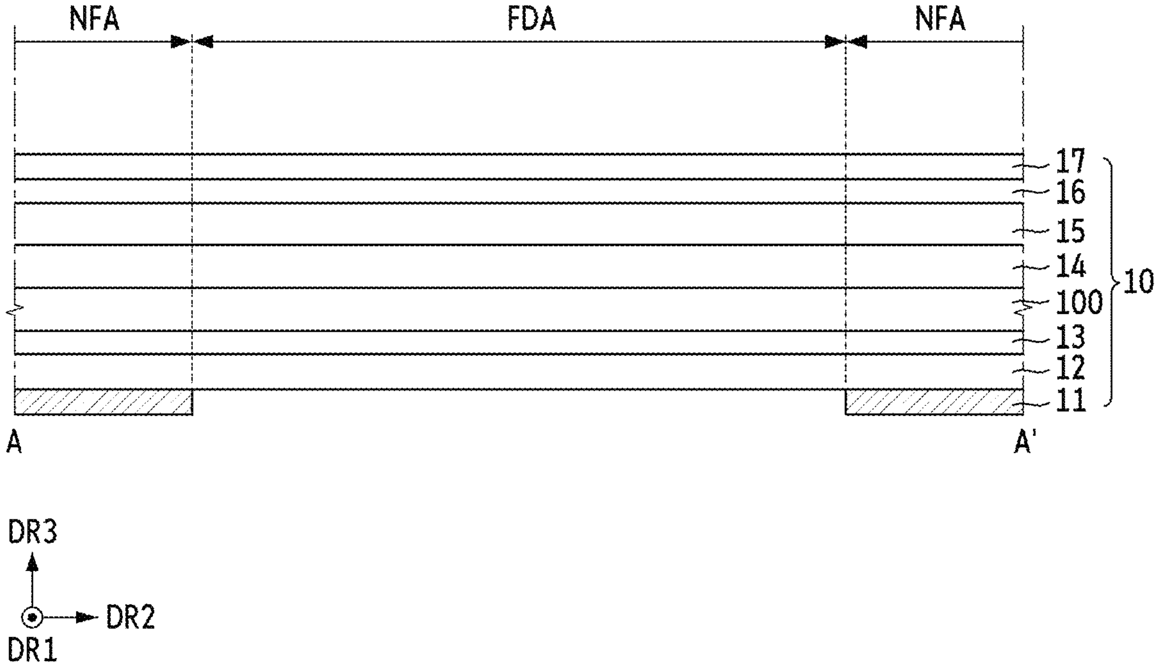
FIG. 3 is a cross-sectional view taken along the line A-A' of FIG. 1.
Figure 4:
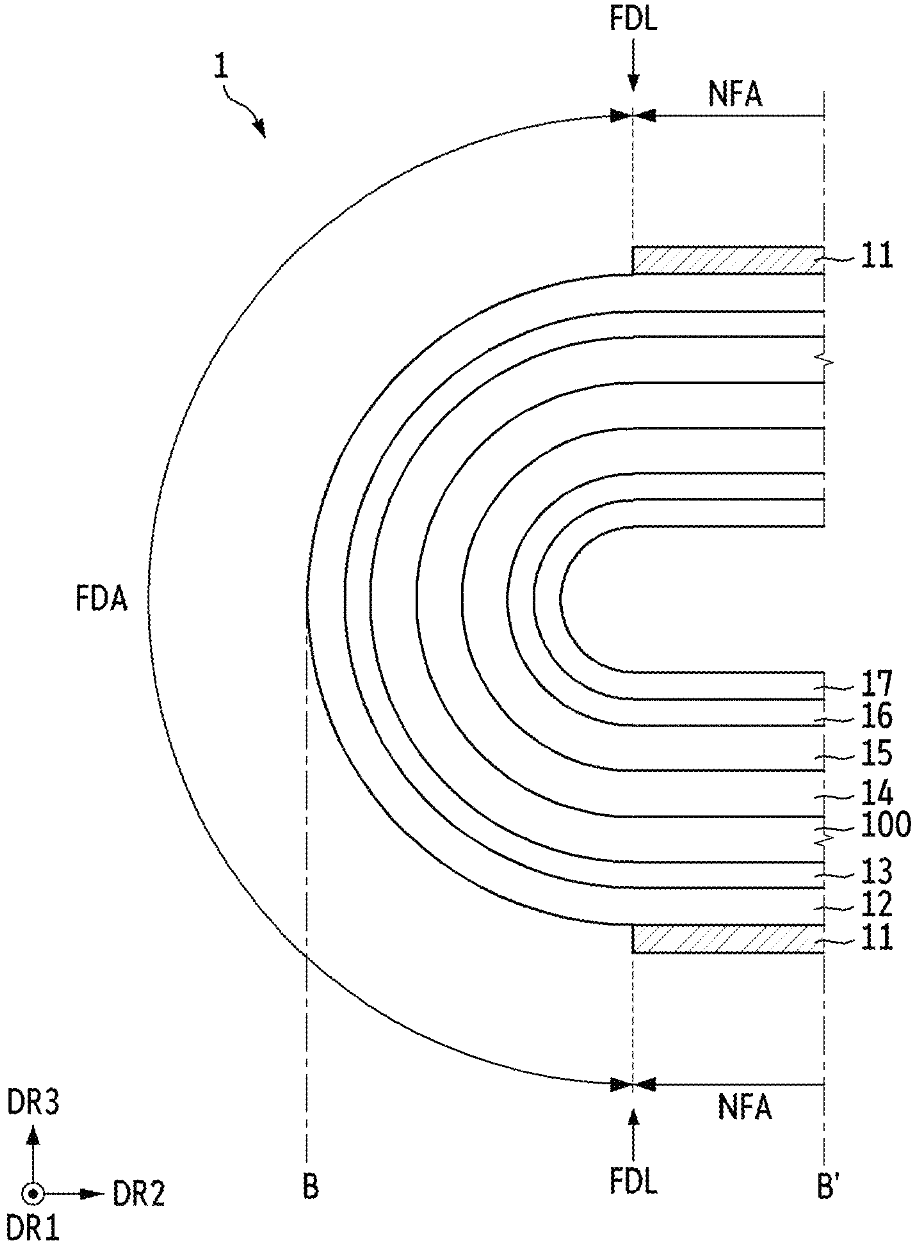
FIG. 4 is a cross-sectional view taken along the line B-B' of FIG. 2.

FIG. 3 is a cross-sectional view taken along the line A-A' of FIG. 1. FIG. 4 is a cross-sectional view taken along the line B-B' of FIG. 2.

As illustrated in FIGS. 3 and 4, the display device 10 according to one or more embodiments may include a display panel 100 for emitting light for displaying an image, a polymer film layer 13 located under a rear surface opposite to a display surface of the display panel 100, a cushion layer 12 located under the polymer film layer 13, a heat dissipation member 11 located under the cushion layer 12 and overlapping the plurality of non-folding areas NFA, an anti-reflection member 14 located on the display surface of the display panel 100, an impact absorbing layer 15 located on the anti-reflection member 14, a cover window 16 located on the impact absorbing layer 15, and a window protective layer 17 located on the cover window 16 (as used herein, "located on" may mean "above").

The anti-reflection member 14 is intended to reduce reflection of external light, and may include a polarizing film.

The impact absorbing layer 15 is intended to cushion external impact transmitted from the cover window 16 to the display panel 100, and may include a transparent flexible material or a transparent elastic material.

The cover window 16 is intended to protect the display surface of the display panel 100 from direct exposure to physical impact, and may include a transparent rigid material. For example, the cover window 16 may include glass or plastic.

The window protective layer 17 is intended for reduction or prevention of scattering, impact absorption, reduction or prevention of scratch, reduction or prevention of fingerprint smudges, and/or reduction or prevention of glare with respect to the cover window 16, and may include a transparent polymer film.

The polymer film layer 13 is intended to protect the rear surface of the display panel 100 from electrical impact, and may include an insulating material. For example, the polymer film layer 13 may include polyimide (PI), polyethylene terephthalate (PET), polycarbonate (PC), polyethylene (PE), polypropylene (PP), polysulfone (PSF), polymethylmethacrylate (PMMA), triacetylcellulose (TAC), cycloolefin polymer (COP), or the like. The polymer film layer 13 may further include a light-absorbing layer including a black pigment or black dye to reduce or prevent light emitted to the rear surface of the display panel 100.

The cushion layer 12 is intended to protect the rear surface of the display panel 100 from physical impact, and may include a cushioning material. For example, the cushion layer 12 may include polyurethane or the like.

The heat dissipation member 11 is intended to dissipate heat from the display panel 11, and may include a metal material with relatively high thermal conductivity. For example, the heat dissipation member 11 may include a metal material, such as copper or silver, or may include graphite or carbon nanotubes.

Because the heat dissipation member 11 includes a metal material having a relatively low ductility, the heat dissipation member 11 may not be located in at least one folding area FDA.

FIG. 4 illustrates the display device 10 that has transformed into an out-folded state.

As shown in the illustration of FIG. 4, in the display device 10 that has transformed into an out-folded state, the plurality of non-folding areas NFA may overlap each other, and the heat dissipation member 11 may be exposed to the outside.

Figure 5:
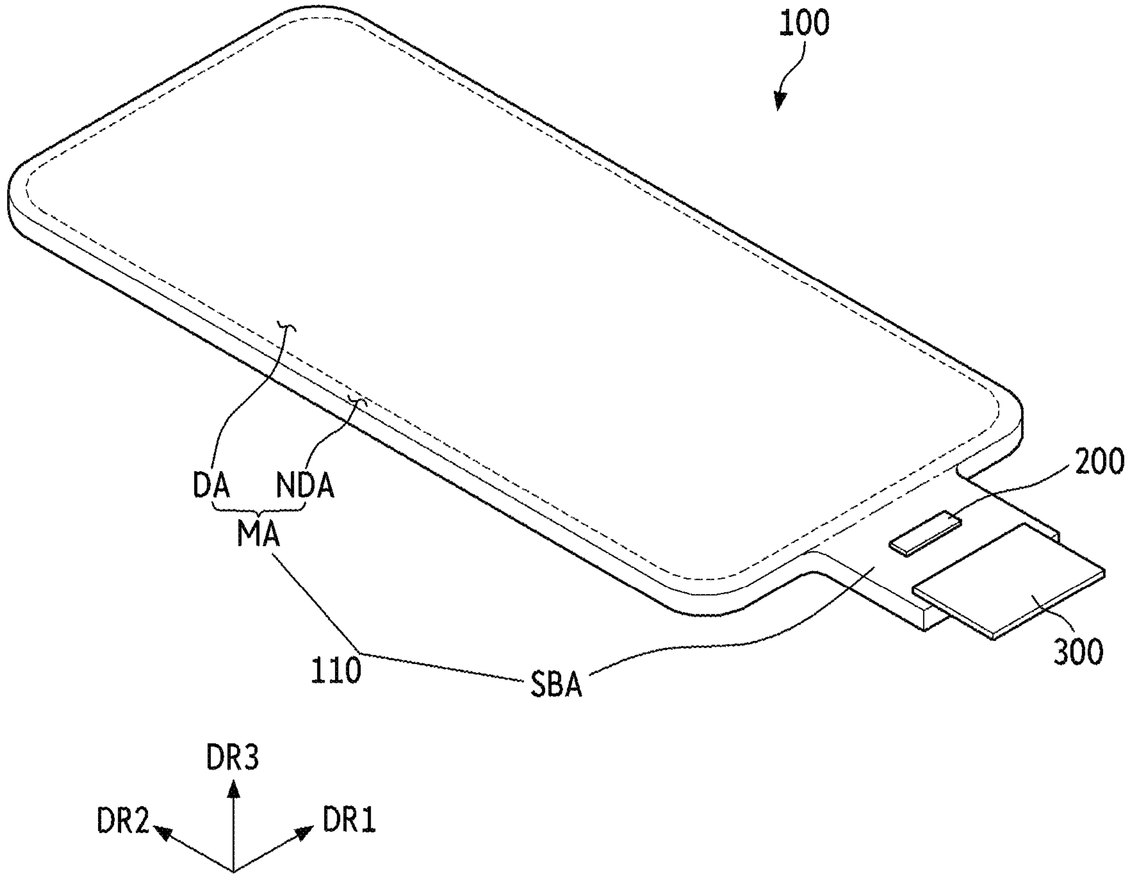
FIG. 5 is a perspective view showing the display panel of FIGS. 3 and 4.
Figure 6:
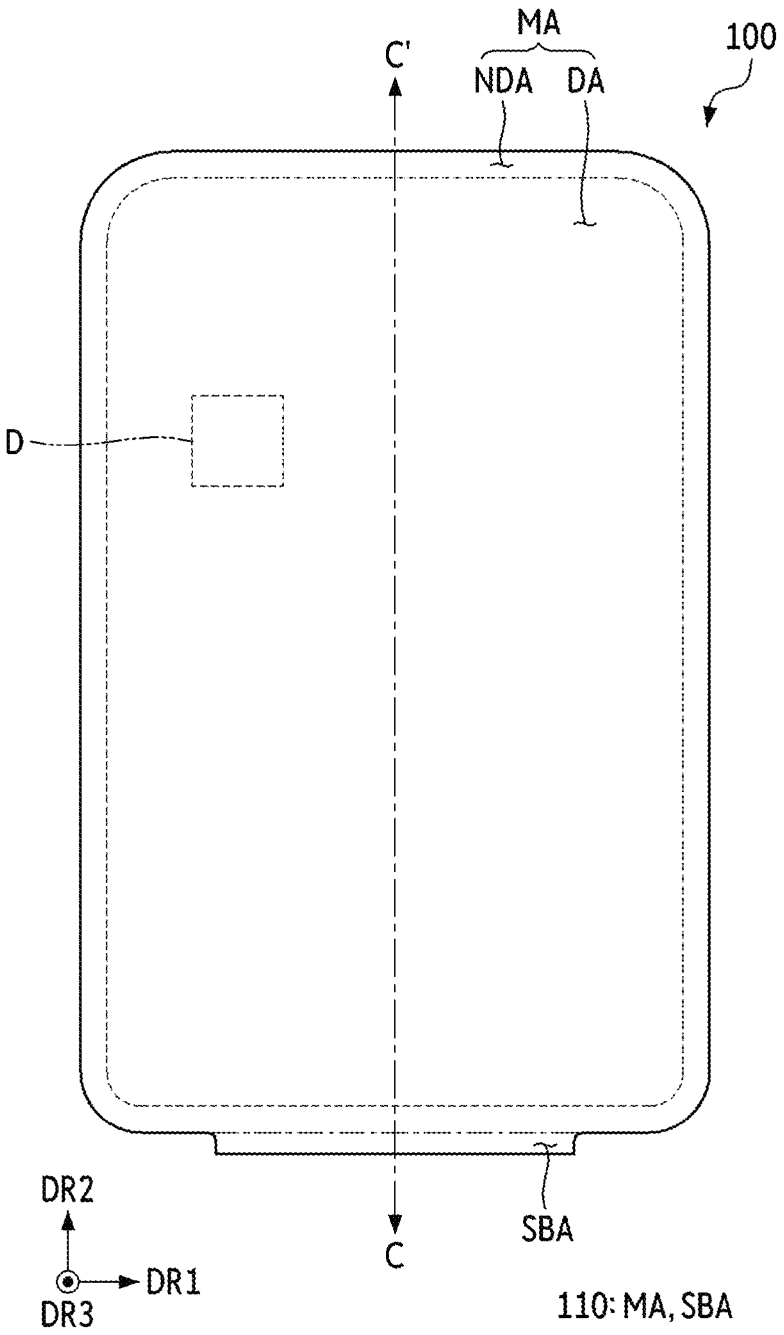
FIG. 6 is a plan view showing the display panel of FIG. 5.
Figure 7:
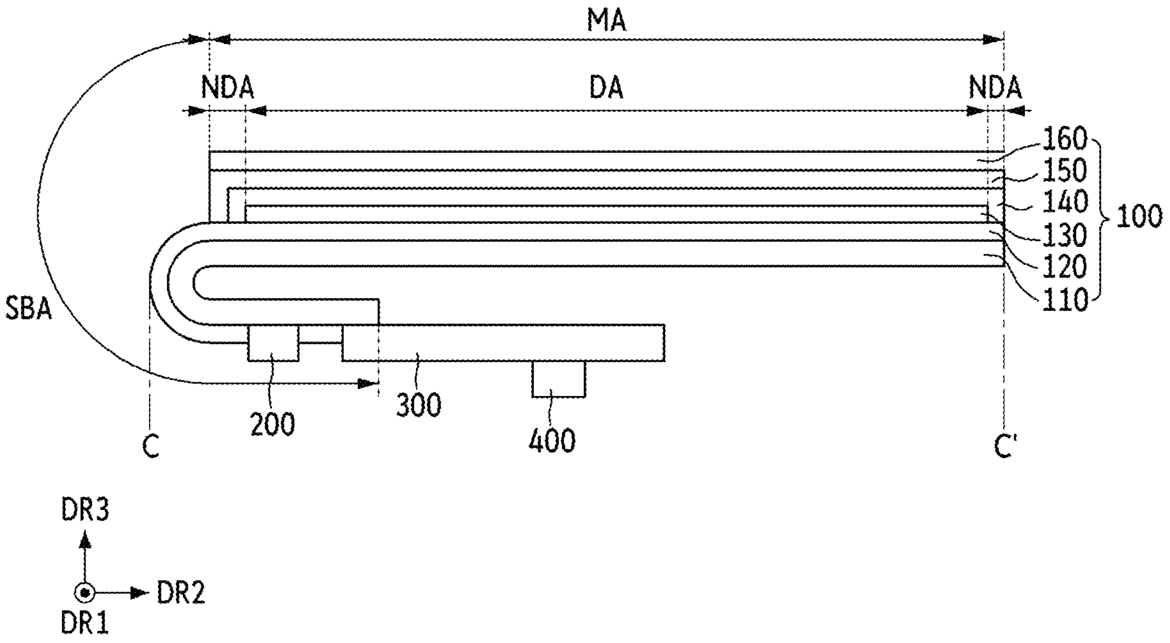
FIG. 7 is a cross-sectional view taken along the line C-C' of FIG. 6.

FIG. 5 is a perspective view showing the display panel of FIGS. 3 and 4. FIG. 6 is a plan view showing the display panel of FIG. 5. FIG. 7 is a cross-sectional view taken along the line C-C' of FIG. 6.

Referring to FIGS. 5 and 6, the display panel 100 of the display device 10 according to one or more embodiments may be a light-emitting display panel, such as an organic light-emitting display panel using an organic light-emitting diode, a quantum dot light-emitting display panel including a quantum dot light-emitting layer, an inorganic light-emitting display panel including an inorganic semiconductor, and an ultra-small light-emitting display panel using an ultra-small light-emitting diode (a micro or nano light-emitting diode (micro LED or nano LED)). The following description is directed to the case where the display panel 100 is an organic light-emitting display panel. However, the present disclosure is not limited thereto, and may be applied to a display device including an organic insulating material, an organic light-emitting material, and a metal material.

According to one or more embodiments, the display panel 100 may be flexibly formed to be capable of being curved, flexed, bent, folded, or rolled such that the display device 10 may be transformed into an unfolded state and a folded state.

As illustrated in FIGS. 5, 6 and 7, the display panel 100 according to embodiments may include a substrate 110.

The substrate 110 may include a main region MA corresponding to a display surface of the display device 10 and a sub-region SBA protruding from one side of the main region MA.

As shown in FIG. 6, the main region MA may include the display area DA located at most of the center thereof, and the non-display area NDA located around the display area DA.

The display area DA may be formed in a rectangular shape having short sides extending in the first direction DR1, and long sides extending in the second direction DR2 crossing the first direction DR1 (in plan view). The corner where the short side in the first direction DR1 and the long side in the second direction DR2 meet may be rounded to have a curvature (e.g., predetermined curvature), or may be right-angled. The planar shape of the display area DA is not limited to the rectangular shape, and may be formed in another polygonal shape, a circular shape, or an elliptical shape.

The non-display area NDA may be located at the edge of the main region MA to surround the display area DA (e.g., in plan view).

The sub-region SBA may be a region protruding from at least a part of one side of the main region MA to one side in the second direction DR2.

The display panel 100 may include a display-driving circuit 200 located in the sub-region SBA, and a display circuit board 300 bonded to one side of the sub-region SBA.

FIGS. 6 and 7 illustrate the display panel 100 with a part of the sub-region SBA in a bent state.

As shown in FIGS. 6 and 7, a part of the sub-region SBA is curved, so that another part of the sub-region SBA may be located on the rear surface of the display panel 100.

Referring to FIG. 7, the display panel 100 includes the substrate 110 including the display area DA and the non-display area NDA, a circuit layer 120 located on the substrate 110, and an element layer 130 located on the circuit layer 120.

The display panel 100 may further include an encapsulation layer 140 located on the element layer 130, and a touch sensor layer 150 located on the encapsulation layer 140.

The display panel 100 may further include a polarization layer 160 located on the touch sensor layer 150, to reduce reflection of external light. The polarization layer 160 may be a part of the anti-reflection member 14 (see FIGS. 3 and 4).

The substrate 110 may be formed of an insulating material, such as polymer resin. For example, the substrate 110 may be formed of polyimide. The substrate 110 may be a flexible substrate, which can be bent, folded or rolled.

Alternatively, the substrate 110 may be formed of an insulating material, such as glass or the like.

The substrate 110 may include the main region MA and the sub-region SBA. The main region MA may include the display area DA and the non-display area NDA.

The display panel 100 may further include the display-driving circuit 200 mounted on the sub-region SBA, the display circuit board 300 bonded to one side of the sub-region SBA, and a touch-driving circuit 400 mounted on the display circuit board 300.

The display-driving circuit 200 may supply a data signal Vdata (see FIG. 9) to data lines DL (see FIG. 9) of the circuit layer 120.

The display circuit board 300 may be connected to signal pads SPD (see FIG. 11) located at the edge of the sub-region SBA, and may be electrically connected to the circuit layer 120 or the display-driving circuit 200.

The touch-driving circuit 400 may be electrically connected to the touch sensor layer 150.

The circuit layer 120 may include insulating layers, conductive layers, and one or more semiconductor layers. One or more insulating layers may be interposed between the conductive layers and one or more semiconductor layers. The circuit layer 120 may include transistors provided in one or more semiconductor layers and one or more conductive layers, and may include signal lines each being provided in at least one of the conductive layers.

The element layer 130 may include light-emitting elements.

The encapsulation layer 140 may cover the circuit layer 120 and the element layer 130, and may block permeation of oxygen or moisture into the element layer 130.

The touch sensor layer 150 may include touch electrodes and touch lines connected thereto.

The touch-driving circuit 400 may apply a touch-driving signal to driving lines of the touch sensor layer 150, and may receive a touch-sensing signal from sensing lines. Further, the touch-driving circuit 400 may detect charge variation amounts of capacitances based on the touch-sensing signal, thereby determining whether a user has touched or approached. The user's touch may mean that an object, such as a pen or a user's finger, is in direct contact with the top surface of the cover window located on the touch sensor layer. The user's approach may mean that the object, such as the pen or the user's finger, hovers over or in proximity to the top surface of the cover window. The touch-driving circuit 400 may output touch data including the user's touch coordinates to a main processor.

Figure 8:
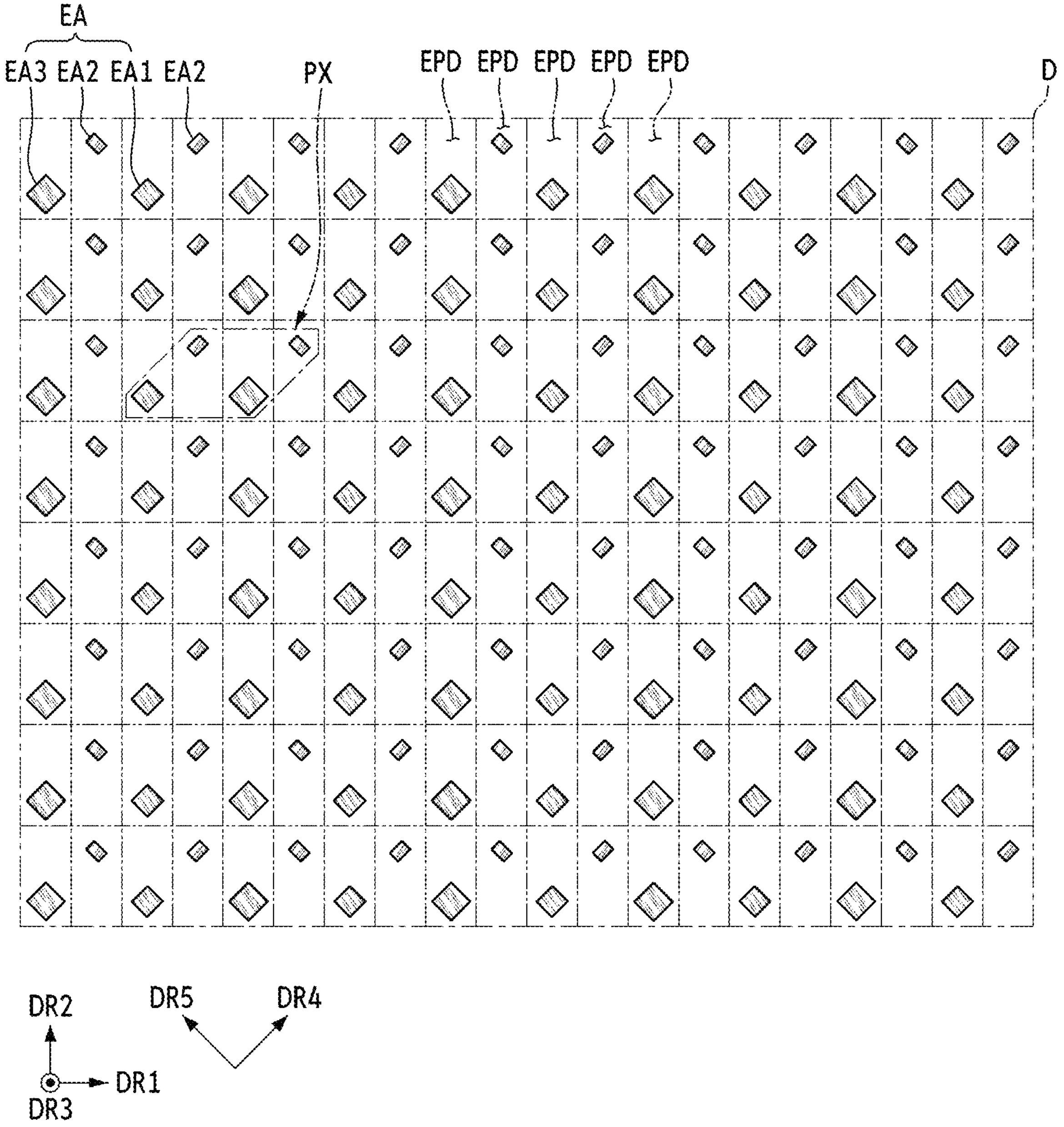
FIG. 8 is a layout diagram illustrating part D of FIG. 6.

FIG. 8 is a layout diagram illustrating part D of FIG. 6.

Referring to FIG. 8, the emission areas EA may be arranged in the display area DA. In addition, the display area DA may include a non-emission area located in a gap between the emission areas EA.

The element layer 130 (see FIG. 7) may include light-emitting elements LE (see FIGS. 9 and 10) respectively located in the emission areas EA.

The circuit layer 120 (see FIG. 7) may include light-emitting pixel drivers EPD arranged side by side in the first direction DR1 and the second direction DR2 in the main region MA. The light-emitting pixel drivers EPD may be respectively electrically connected to the light-emitting elements LE (see FIGS. 9 and 10) of the element layer 130.

The emission areas EA may have a rhombic shape or a rectangular shape in plan view. However, this is only an example, and the planar shape of the emission areas EA according to one or more embodiments is not limited to that illustrated in FIG. 8. That is, in plan view, the emission areas EA may have a polygonal shape, such as a quadrangle, a pentagon, and a hexagon, or may have a circular or elliptical shape including the edge of a curve.

The emission areas EA may include first emission areas EA1 that emit light in a first wavelength band, second emission areas EA2 that emit light in a second wavelength band that is lower than the first wavelength band, and third emission areas EA3 that emit light in a third wavelength band that is lower than the second wavelength band.

For example, the first wavelength band may be about 600 nm to about 750 nm, and the light in the first wavelength band may be red. The second wavelength band is about 480 nm to about 560 nm, and light in the second wavelength band may be green. The third wavelength band is about 370 nm to about 460 nm, and light in the third wavelength band may be blue.

The first emission areas EA1 and the third emission areas EA3 may be alternately arranged in the first direction DR1 or the second direction DR2.

The second emission area EA2 may be parallel to each other in the first direction DR1 or the second direction DR2.

The second emission areas EA2 may be adjacent to the first emission areas EA1 and the third emission areas EA3 in diagonal directions DR4 and DR5 crossing the first direction DR1 and the second direction DR2.

Pixels PX for displaying their own luminances and colors may be provided by the first emission area EA1, the second emission area EA2, and the third emission area EA3 that are adjacent to each other, among these emission areas EA. In other words, the pixel PX may be a basic unit for displaying various colors including white with a luminance (e.g., predetermined luminance).

Each of the pixels PX may include at least one first emission area EA1, at least one second emission area EA2, and at least one third emission area EA3 that are adjacent to each other. Accordingly, each of the pixels PX may display various colors through a mixture of the light emitted from the first emission area EA1, the second emission area EA2, and the third emission area EA3 that are adjacent to each other.

Figure 9:
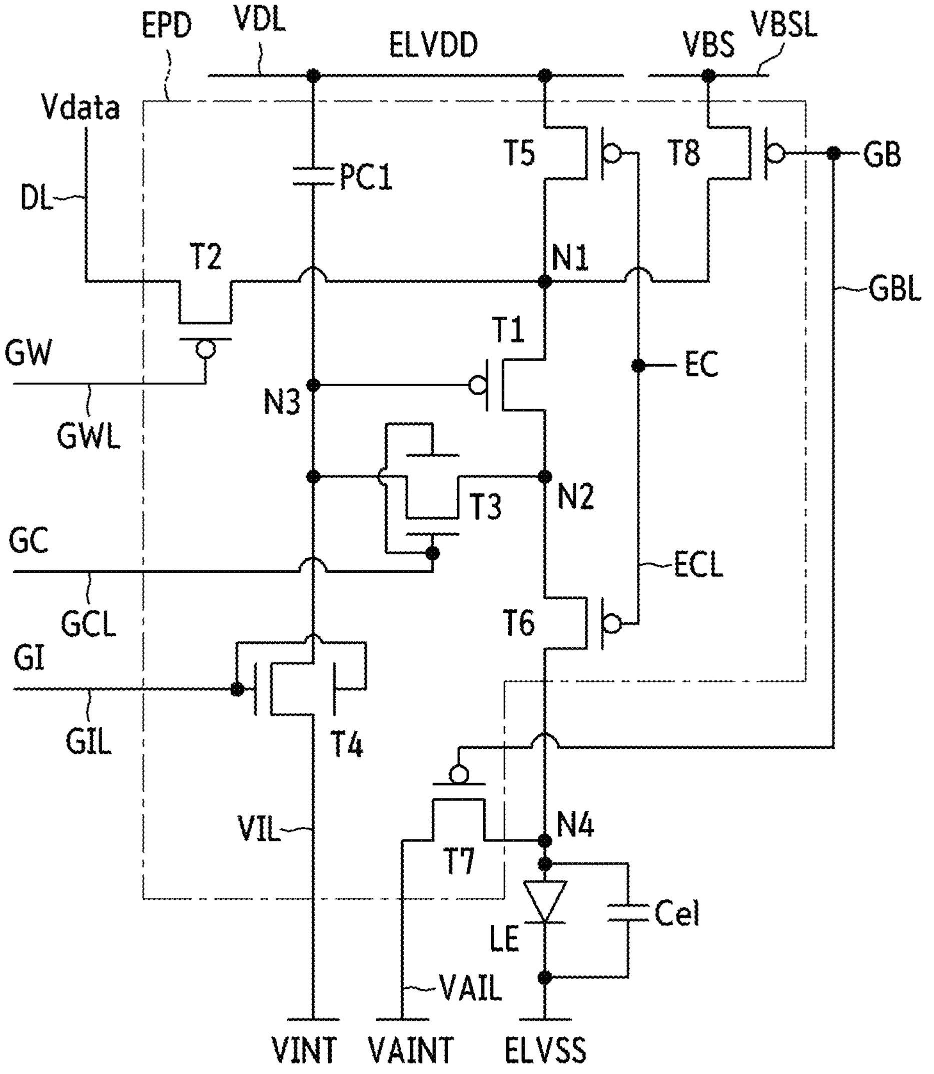
FIG. 9 is an equivalent circuit diagram showing the light-emitting pixel driver of FIG. 8.

FIG. 9 is an equivalent circuit diagram showing the light-emitting pixel driver of FIG. 8.

Referring to FIG. 9, the light-emitting pixel drivers EPD of the circuit layer 120 may be electrically connected between a first power source ELVDD and the light-emitting elements LE of the element layer 130.

The light-emitting elements LE of the element layer 130 may be electrically connected between the light-emitting pixel drivers EPD of the circuit layer 120 and a second power source ELVSS. That is, an anode electrode of one light-emitting element LE may be electrically connected to the light-emitting pixel driver EPD, and the second power source ELVSS having a lower voltage level than the first power source ELVDD may be applied to a cathode electrode of one light-emitting element LE.

A capacitor Cel connected in parallel with the light-emitting element LE refers to a parasitic capacitance between the anode electrode and the cathode electrode.

The circuit layer 120 may include gate lines GL that transmit gate signals to the light-emitting pixel drivers EPD. The gate lines GL may be electrically connected to a gate electrode of at least one of transistors T1 to T8 provided in each of the light-emitting pixel drivers EPD, and may transmit a gate signal.

The gate lines GL may include a scan write line GWL for transmitting a scan write signal GW, a scan initialization line GIL for transmitting a scan initialization signal GI, an emission control line ECL for transmitting an emission control signal EC, a gate control line GCL for transmitting a gate control signal GC, and a bias control line GBL for transmitting a bias control signal GB.

The circuit layer 120 may include the data line DL for transmitting the data signal Vdata, a first power line VDL for transmitting the first power source ELVDD, a gate initialization voltage line VIL for transmitting a gate initialization voltage VINT, an anode initialization voltage line VAIL for transmitting an anode initialization voltage VAINT, and a bias voltage line VBSL for transmitting a bias voltage VBS.

Each of the light-emitting pixel drivers EPD may include a first transistor T1 for generating a driving current of the light-emitting element LE, two or more transistors T2 to T8 electrically connected to the first transistor T1 or the light-emitting element LE, and at least one pixel capacitor PC1.

The first transistor T1 may be electrically connected between a first node N1 and a second node N2. The first node N1 is electrically connected to the first electrode (e.g., source electrode) of the first transistor T1. The second node N2 is electrically connected to the second electrode (e.g., drain electrode) of the first transistor T1.

The first node N1 may be electrically connected to the first power line VDL through the fifth transistor T5.

The second node N2 may be electrically connected to the anode electrode of the light-emitting element LE through the sixth transistor T6.

The pixel capacitor PC1 may be electrically connected between the first power line VDL and a third node N3. The third node N3 is electrically connected to the gate electrode of the first transistor T1. That is, the pixel capacitor PC1 may be electrically connected between the gate electrode of the first transistor T1 and the first power line VDL. Accordingly, the potential of the gate electrode of the first transistor T1 may be maintained at the voltage charged in the pixel capacitor PC1.

The second transistor T2 may be electrically connected between the data line DL and the first node N1. The second transistor T2 may be electrically connected between the first electrode of the first transistor T1 and the data line DL. That is, the first electrode of the first transistor T1 may be electrically connected to the data line DL through the second transistor T2.

The second transistor T2 may be turned on by the scan write signal GW of the scan write line GWL.

The fifth transistor T5 may be electrically connected between the first node N1 and the first power line VDL.

The sixth transistor T6 may be electrically connected between the second node N2 and a fourth node N4. The fourth node N4 is electrically connected to the anode electrode of the light-emitting element LE. That is, the fifth transistor T5 may be electrically connected between the first electrode of the first transistor T1 and the first power line VDL.

The sixth transistor T6 may be electrically connected between the second electrode of the first transistor T1 and the anode electrode of the light-emitting element LE.

The fifth transistor T5 and the sixth transistor T6 may be turned on by the emission control signal EC of the emission control line ECL.

When the data signal Vdata of the data line DL is transmitted to the first electrode of the first transistor T1 through the turned-on second transistor T2, the voltage difference between the gate electrode of the first transistor T1 and the first electrode of the first transistor T1 may be a difference voltage between the first power source ELVDD and the data signal Vdata. In this case, when the voltage difference between the gate electrode of the first transistor T1 and the first electrode of the first transistor T1 (e.g., the gate-source voltage difference becomes equal to or greater than a threshold voltage), then the first transistor T1 may be turned on, thereby generating a drain-source current of the first transistor T1 corresponding to the data signal Vdata.

Subsequently, when the fifth transistor T5 and the sixth transistor T6 are turned on, the first power source ELVDD, the first transistor T1, the light-emitting element LE, and the second power source ELVSS may be connected in series. Accordingly, the drain-source current of the first transistor T1 corresponding to the data signal Vdata may be supplied as a driving current of the light-emitting element LE.

Accordingly, the light-emitting element LE may emit light having a luminance corresponding to the data signal Vdata.

The third transistor T3 may be electrically connected between the second node N2 and the third node N3. That is, the third transistor T3 may be electrically connected between the gate electrode of the first transistor T1 and the second electrode of the first transistor T1. The third transistor T3 may be turned on by the gate control signal GC of the gate control line GCL.

Through the turned-on third transistor T3, the voltage difference between the second node N2 and the third node N3 may be initialized.

The fourth transistor T4 may be electrically connected between the gate initialization voltage line VIL and the third node N3. That is, the fourth transistor T4 may be connected between the gate electrode of the first transistor T1 and the gate initialization voltage line VIL. The fourth transistor T4 may be turned on by the scan initialization signal GI of the scan initialization line GIL.

Through the turned-on fourth transistor T4, the potential of the third node N3 may be initialized to the gate initialization voltage VINT of the gate initialization voltage line VIL.

The third transistor T3 and the fourth transistor T4 may be provided as N-type MOSFETs.

The seventh transistor T7 may be electrically connected between the fourth node N4 and the anode initialization voltage line VAIL. That is, the seventh transistor T7 may be electrically connected between the anode electrode of the light-emitting element LE and the anode initialization voltage line VAIL. The seventh transistor T7 may be turned on by the bias control signal GB of the bias control line GBL.

The potential of the fourth node N4 may be initialized through the turned-on seventh transistor T7.

The eighth transistor T8 may be electrically connected between the first node N1 and the bias voltage line VBL. That is, the eighth transistor T8 may be electrically connected between the first electrode of the first transistor T1 and the bias voltage line VBL. The eighth transistor T8 may be turned on by the bias control signal GB of the bias control line GBL.

The potential of the first node N1 may be initialized through the turned-on eighth transistor T8.

Each of the third transistor T3 and the fourth transistor T4 among the first to eighth transistors T1 to T8 included in the light-emitting pixel driver EPD may be implemented as an N-type MOSFET, and each of the remaining transistors T1, T2, and T5 to T8 may be implemented as a P-type MOSFET.

Accordingly, the circuit layer 120 may include a first semiconductor layer SEL1 (see FIG. 10) for providing a P-type MOSFET, and a second semiconductor layer SEL2 (see FIG. 10) for providing an N-type MOSFET.

Figure 10:
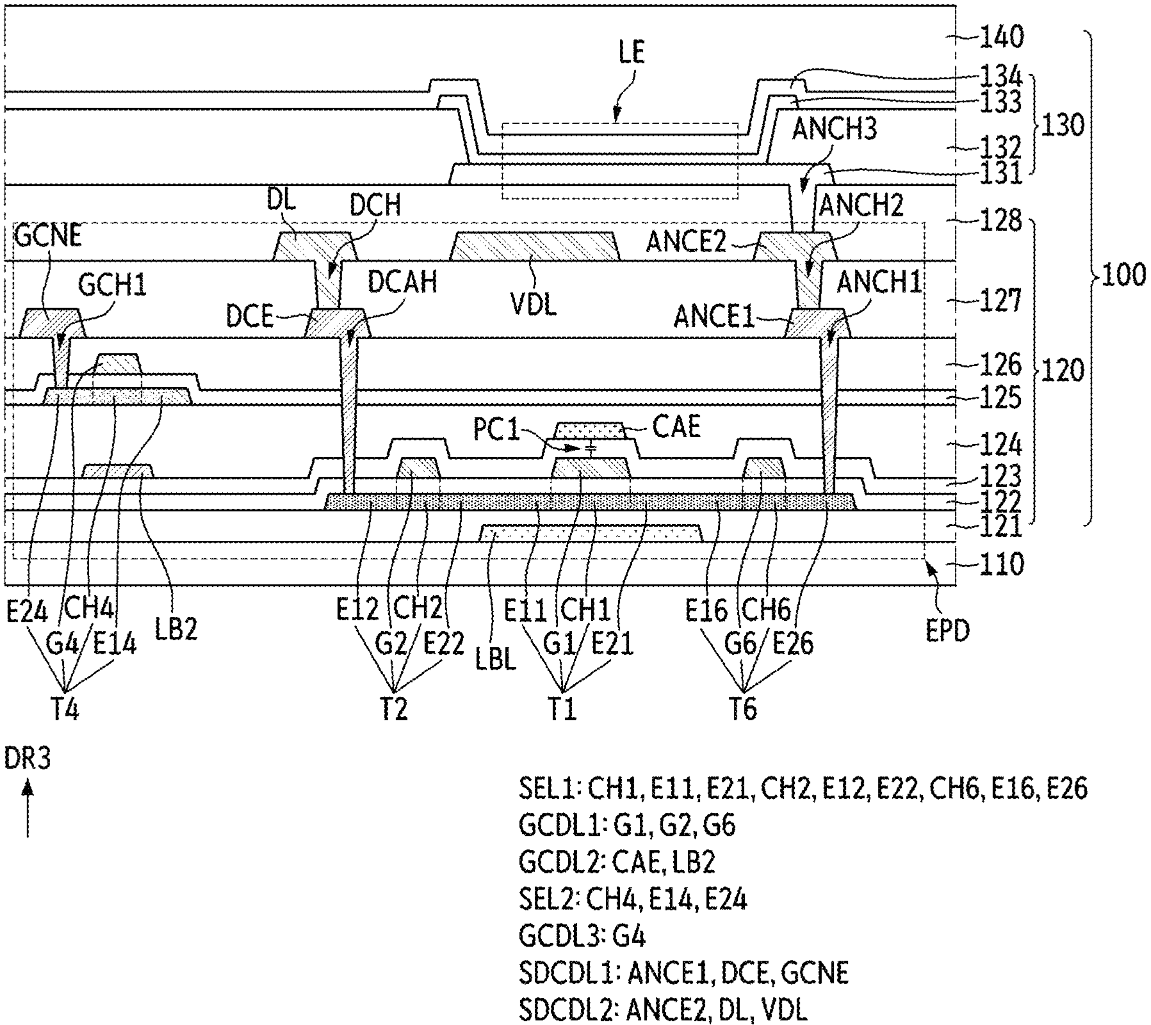
FIG. 10 is a cross-sectional view showing the first transistor, the second transistor, the fourth transistor, the sixth transistor, and the light-emitting element of FIG. 9.

FIG. 10 is a cross-sectional view showing the first transistor, the second transistor, the fourth transistor, the sixth transistor, and the light-emitting element of FIG. 9.

Referring to FIG. 10, the circuit layer 120 may include the first semiconductor layer SEL1 located on the substrate 110, a first gate-insulating layer 122 covering the first semiconductor layer SEL1, a first gate conductive layer GCDL1 located on the first gate-insulating layer 122, a second gate-insulating layer 123 covering the first gate conductive layer GCDL1, a second gate conductive layer GCDL2 located on the second gate-insulating layer 123, a first interlayer insulating layer 124 covering the second gate conductive layer GCDL2, the second semiconductor layer SEL2 located on the first interlayer insulating layer 124, a third gate-insulating layer 125 covering the second semiconductor layer SEL2, a third gate conductive layer GCDL3 located on the third gate-insulating layer 125, a second interlayer insulating layer 126 covering the third gate conductive layer GCDL3, a first source-drain conductive layer SDCDL1 located on the second interlayer insulating layer 126, a first planarization layer 127 covering the first source-drain conductive layer SDCDL1, a second source-drain conductive layer SDCDL2 located on the first planarization layer 127, and a second planarization layer 128 covering the second source-drain conductive layer SDCDL2.

The circuit layer 120 may further include a first light-blocking layer LBL located on the substrate 110, and a buffer layer 121 covering the first light-blocking layer LBL. In this case, the first semiconductor layer SEL1 may be located on the buffer layer 121.

In the light-emitting pixel drivers EPD, the channel portion, the first electrode portion, and the second electrode portion of each of the first transistor T1, the second transistor T2, the fifth transistor T5 (see FIG. 9), the sixth transistor T6, the seventh transistor T7 (see FIG. 9), and the eighth transistor T8 (see FIG. 9), which are provided as P-type MOSFETs, may be located in the first semiconductor layer SEL1, and the gate electrode may be located in the first gate conductive layer GCDL1 or the second gate conductive layer GCDL2.

In the light-emitting pixel drivers EPD, the channel portion, the first electrode portion, and the second electrode portion of each of the third transistor T3 (see FIG. 9) and the fourth transistor T4, which are provided as N-type MOSFETs, may be located in the second semiconductor layer SEL2, and the gate electrode may be located in the third gate conductive layer GCDL3.

In each of the first transistor T1, the second transistor T2, the third transistor T3 (see FIG. 9), the fourth transistor T4, the fifth transistor T5, the sixth transistor T6, the seventh transistor T7, and the eighth transistor T8, the first electrode portion may be connected to one side of the channel portion, the second electrode portion may be connected to the other side of the channel portion, and the gate electrode may overlap the channel portion. The first electrode portion may become the first electrode, and the second electrode portion may become the second electrode.

As illustrated in FIG. 10, the first transistor T1 may include a channel portion CH1, a first electrode portion E11, and a second electrode portion E21 located in the first semiconductor layer SEL1 on the buffer layer 121, and a gate electrode G1 located in the first gate conductive layer GCDL1 on the first gate-insulating layer 122.

The channel portion CH1 of the first transistor T1 may overlap the first light-blocking layer LBL on the substrate 110 and the gate electrode G1 of the first transistor T1.

The second transistor T2 may include a channel portion CH2, a first electrode portion E12, and a second electrode portion E22 located in the first semiconductor layer SEL1 on the buffer layer 121, and a gate electrode G2 located in the first gate conductive layer GCDL1 on the first gate-insulating layer 122.

The channel portion CH2 of the second transistor T2 may overlap the gate electrode G2 of the second transistor T2.

The sixth transistor T6 may include a channel portion CH6, a first electrode portion E16, and a second electrode portion E26 located in the first semiconductor layer SEL1 on the buffer layer 121, and a gate electrode G6 located in the first gate conductive layer GCDL1 on the first gate-insulating layer 122.

The channel portion CH6 of the sixth transistor T6 may overlap the gate electrode G6 of the sixth transistor T6.

The first electrode portion E12 of the second transistor T2 may be electrically connected to the data line DL through a data connection electrode DCE.

The data connection electrode DCE may be located the first source-drain conductive layer SDCDL1 on the second interlayer insulating layer 126, and may be electrically connected to the first electrode portion E12 of the second transistor T2 through a data connection auxiliary hole DCAH penetrating the second interlayer insulating layer 126, the third gate-insulating layer 125, the first interlayer insulating layer 124, the second gate-insulating layer 123, and the first gate-insulating layer 122.

The data line DL may be located in the second source-drain conductive layer SDCDL2 on the first planarization layer 127, and may be electrically connected to the data connection electrode DCE through a data connection hole DCH penetrating the first planarization layer 127.

The second electrode portion E22 of the second transistor T2 may be connected to the first electrode portion E11 of the first transistor T1.

The second electrode portion E21 of the first transistor T1 may be connected to the first electrode portion E16 of the sixth transistor T6.

The second electrode portion E26 of the sixth transistor T6 may be electrically connected to the anode electrode 131 through a first anode connection electrode ANCE1 and a second anode connection electrode ANCE2.

The first anode connection electrode ANCE1 may be located in the first source-drain conductive layer SDCDL1 on the second interlayer insulating layer 126, and may be electrically connected to the second electrode portion E26 of the sixth transistor T6 through a first anode connection hole ANCH1 penetrating the second interlayer insulating layer 126, the third gate-insulating layer 125, the first interlayer insulating layer 124, the second gate-insulating layer 123, and the first gate-insulating layer 122.

The second anode connection electrode ANCE2 may be located in the second source-drain conductive layer SDCDL2 on the first planarization layer 127, and may be electrically connected to the first anode connection electrode ANCE1 through a second anode connection hole ANCH2 penetrating the first planarization layer 127.

The anode electrode 131 may be located on the second planarization layer 128, and may be electrically connected to the second anode connection electrode ANCE2 through a third anode connection hole ANCH3 penetrating the second planarization layer 128.

The pixel capacitor PC1 may be provided by an overlapping area between the capacitor electrode CAE and the gate electrode G1 of the first transistor T1.

The capacitor electrode CAE may be located in the second gate conductive layer GCDL2 on the second gate-insulating layer 123.

The fourth transistor T4 may include a channel portion CH4, a first electrode portion E14, and a second electrode portion E24 located in the second semiconductor layer SEL2 on the first interlayer insulating layer 124, and a gate electrode G4 located in the third gate conductive layer GCDL3 on the third gate-insulating layer 125.

The channel portion CH4 of the fourth transistor T4 may overlap a second light-blocking layer LB2 and the gate electrode G4 of the fourth transistor T4.

The second light-blocking layer LB2 may be located in the second gate conductive layer GCDL2 on the second gate-insulating layer 123.

The second electrode portion E24 of the fourth transistor T4 may be electrically connected to the gate electrode G1 of the first transistor T1 through a gate connection electrode GCNE.

The gate connection electrode GCNE may be located in the first source-drain conductive layer SDCDL1 on the second interlayer insulating layer 126.

The gate connection electrode GCNE may be electrically connected to the second electrode portion E24 of the fourth transistor T4 through a gate connection hole GCH1 penetrating the second interlayer insulating layer 126 and the third gate-insulating layer 125.

Meanwhile, because the third transistor T3 has a structure similar to that of the fourth transistor T4, and the fifth transistor T5, the seventh transistor T7, and the eighth transistor T8 have structures similar to those of the second transistor T2 and the sixth transistor T6, redundant description will be omitted below.

The first power line VDL may be located in the second source-drain conductive layer SDCDL2 on the first planarization layer 127.

The element layer 130 may include the light-emitting elements LE respectively located in the emission areas EA on the circuit layer 120.

Each of the light-emitting elements LE may include a structure in which a light-emitting layer 133 is located between the anode electrode 131 and a cathode electrode 134 facing each other.

According to embodiments, the element layer 130 may include the anode electrodes 131 respectively located in the emission areas EA, a pixel-defining layer 132 located in the non-emission area between the emission areas EA and covering the edge of the anode electrode 131, light-emitting layers 133 respectively located on the anode electrodes 131, and the cathode electrode 134 located on the light-emitting layers 133 and the pixel-defining layer 132.

Each of the light-emitting elements LE may further include first common layers located between the anode electrodes 131 and the light-emitting layers 133, and a second common layer located between the light-emitting layers 133 and the cathode electrode 134.

The encapsulation layer 140 may be located on the circuit layer 120, and may cover the element layer 130.

The encapsulation layer 140 may block the permeation of oxygen or moisture into the element layer 130, and may reduce electrical or physical impact to the circuit layer 120 and the element layer 130.

The encapsulation layer 140 may include a first encapsulation layer located on the element layer 130 and containing an inorganic insulating material, a second encapsulation layer located on the first encapsulation layer and containing an organic insulating material, and a third encapsulation layer covering the second encapsulation layer and containing an inorganic insulating material.

Figure 11:
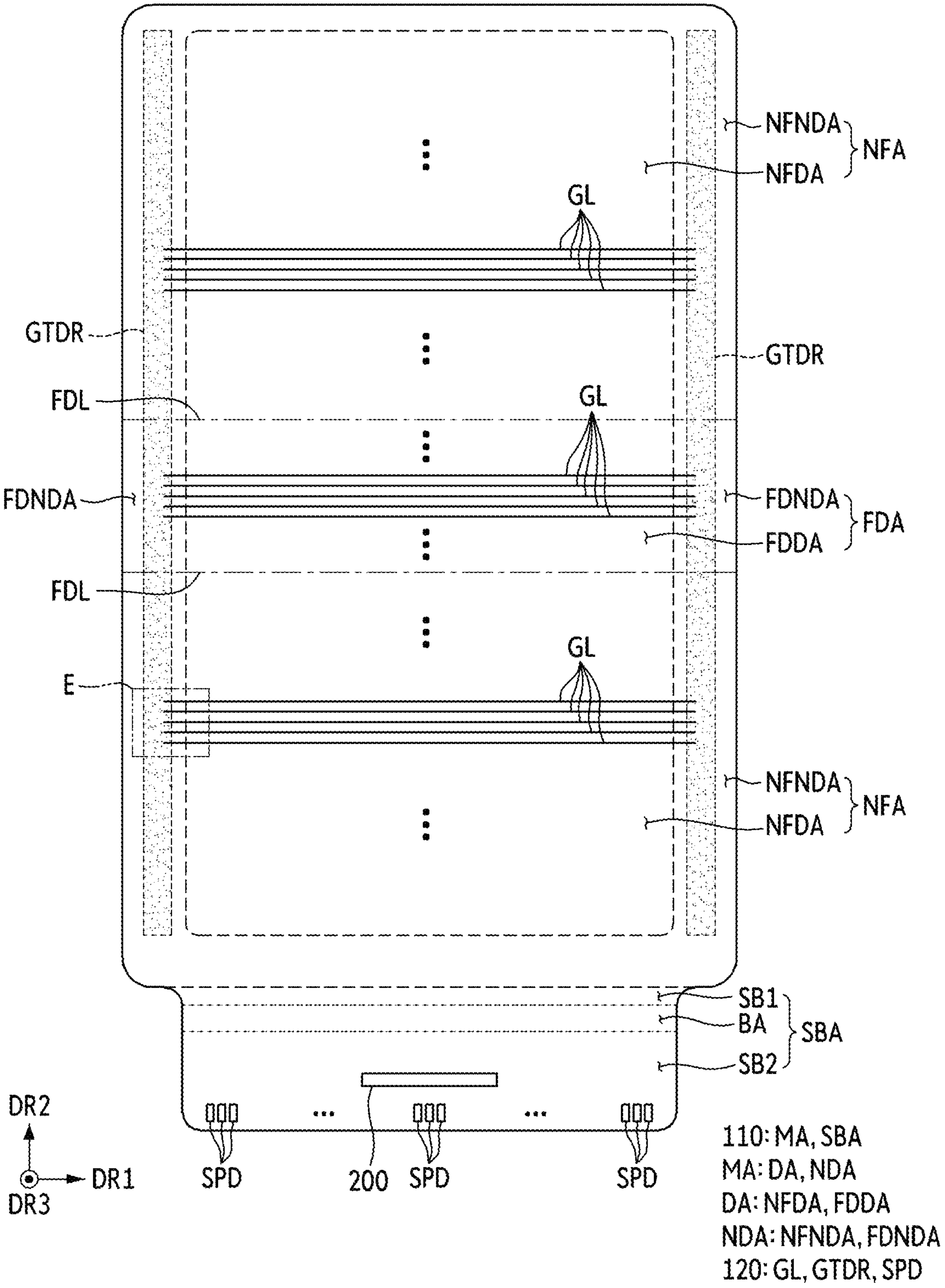
FIG. 11 is a plan view showing the substrate and circuit layer of FIG. 7.
Figure 12:
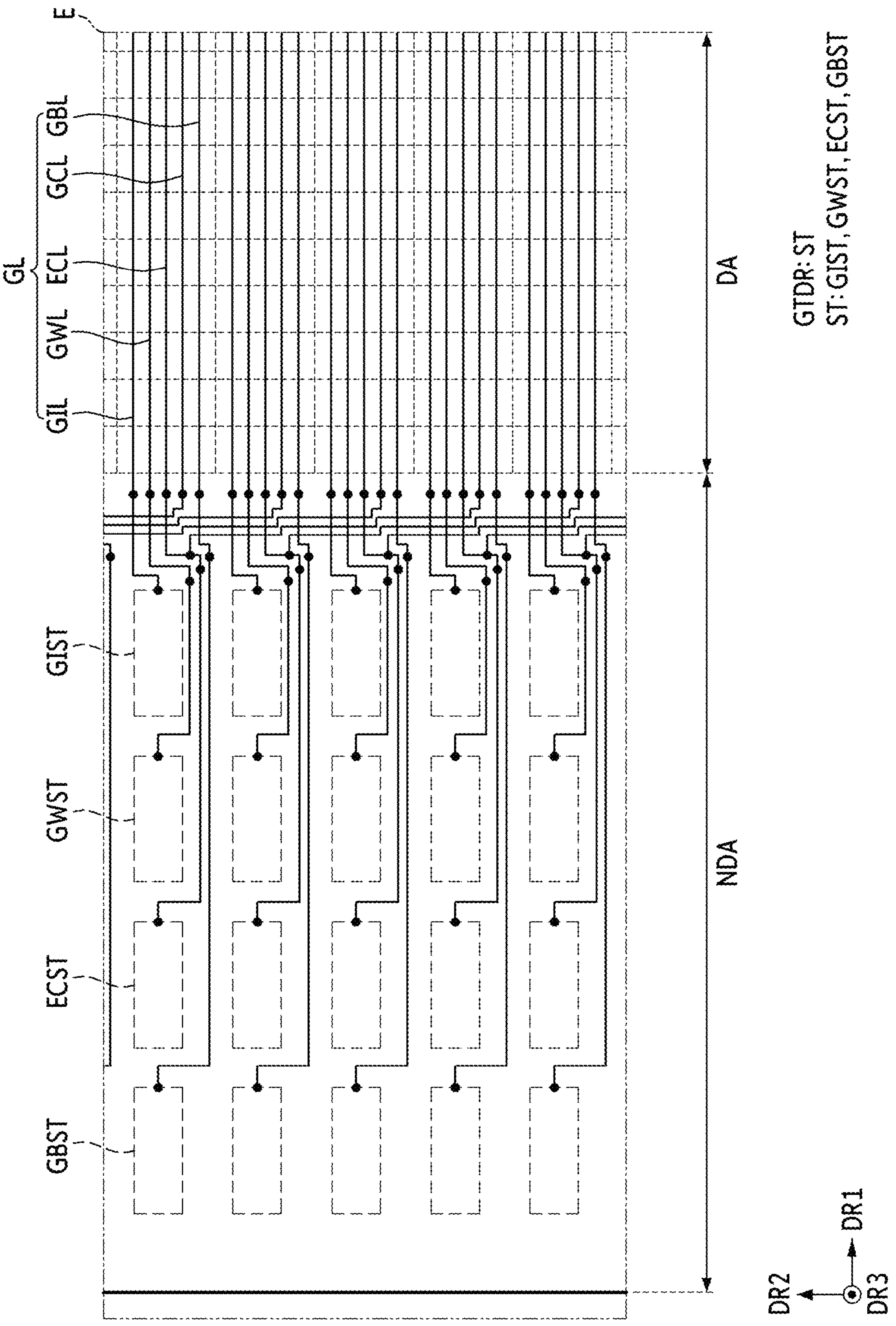
FIG. 12 is a layout diagram illustrating part E of FIG. 11.

FIG. 11 is a plan view showing the substrate and circuit layer of FIG. 7. FIG. 12 is a layout diagram illustrating part E of FIG. 11.

Referring to FIG. 11, the display device 10 according to one or more embodiments includes the plurality of non-folding areas NFA that maintain a planar shape, at least one folding area FDA located therebetween and able to transform into a bent shape and into a planar shape, and the display panel 100 that emits light for displaying an image.

According to one or more embodiments, the plurality of non-folding areas NFA may be arranged side by side in the second direction DR2, and a plurality of folding lines FDL, which are boundaries between the plurality of non-folding areas NFA and at least one folding area FDA, may extend in the first direction DR1.

The substrate 110 of the display panel 100 may include the main region MA corresponding to the emission surface of the display device 10, and the sub-region SBA protruding from at least a part of one side of the main region MA.

The sub-region SBA may include a bending area BA that is transformed into a bent shape, a first sub-region SB1 located between one side of the bending area BA and the main region MA, and a second sub-region SB2 connected to the other side of the bending area BA.

When the bending area BA is transformed into a bent shape, the second sub-region SB2 may be located below the substrate 110, and may overlap the main region MA.

The display-driving circuit 200 may be located in the second sub-region SB2.

Signal pads SPD bonded to the display circuit board 300 (see FIG. 7) may be located at one edge of the second sub-region SB2.

The main region MA may include the display area DA in which the emission areas EA (see FIG. 8) are arranged, and the non-display area NDA located around the display area DA. That is, the substrate 110 includes the display area DA and the non-display area NDA.

The display area DA may include the plurality of non-folding display areas NFDA overlapping the plurality of non-folding areas NFA, and at least one folding display area FDDA overlapping at least one folding area FDA.

The non-display area NDA may include the plurality of non-folding non-display areas NFNDA overlapping the plurality of non-folding areas NFA, and at least one folding non-display area FDNDA overlapping at least one folding area FDA.

The circuit layer 120 of the display panel 100 may include the light-emitting pixel drivers EPD (see FIG. 10) electrically connected to the light-emitting elements LE (see FIG. 10) of the element layer 120 (see FIG. 10), the gate lines GL that transmit gate signals to the light-emitting pixel drivers EPD, and a gate-driving circuit GTDR including stages ST (see FIG. 12) electrically connected to the gate lines GL.

Each of the gate lines GL may extend in the first direction DR1.

The gate-driving circuit GTDR may be located in the non-display area NDA. The gate-driving circuit GTDR may be located in a partial area of the non-display area NDA facing the display area DA in the first direction DR1.

Referring to FIG. 12, the gate-driving circuit GTDR may include the stages ST electrically connected to the gate lines GL.

Each of the stages ST may be electrically connected to at least one of the gate lines GL.

The gate lines GL may include the scan write line GWL, the scan initialization line GIL, the emission control line ECL, the gate control line GCL, and the bias control line GBL.

The stages ST may include a scan write stage GWST electrically connected to the scan write line GWL, a scan initialization stage GIST electrically connected to the scan initialization line GIL, an emission control stage ECST electrically connected to the emission control line ECL and the gate control line GCL at the other end, and a bias control stage GBST electrically connected to the bias control line GBL.

Figure 13:
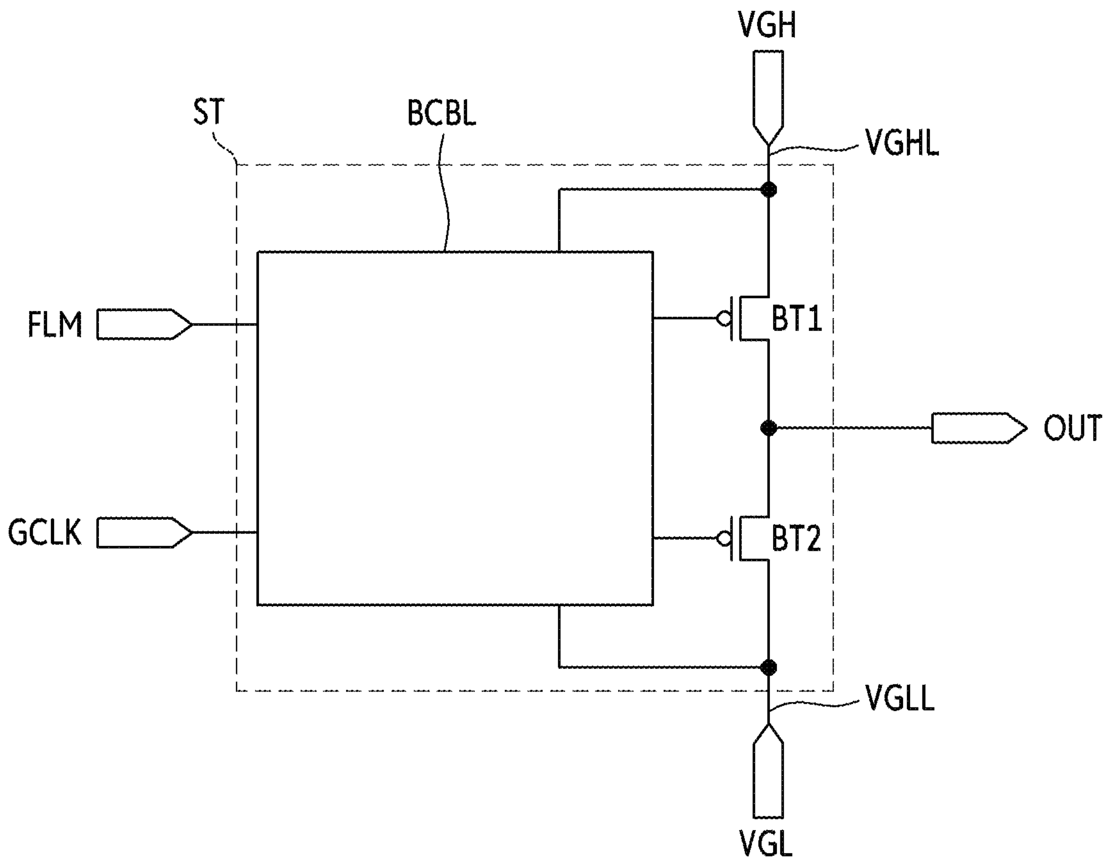
FIG. 13 is a block diagram showing one of the stages of FIG. 12.
Figure 14:
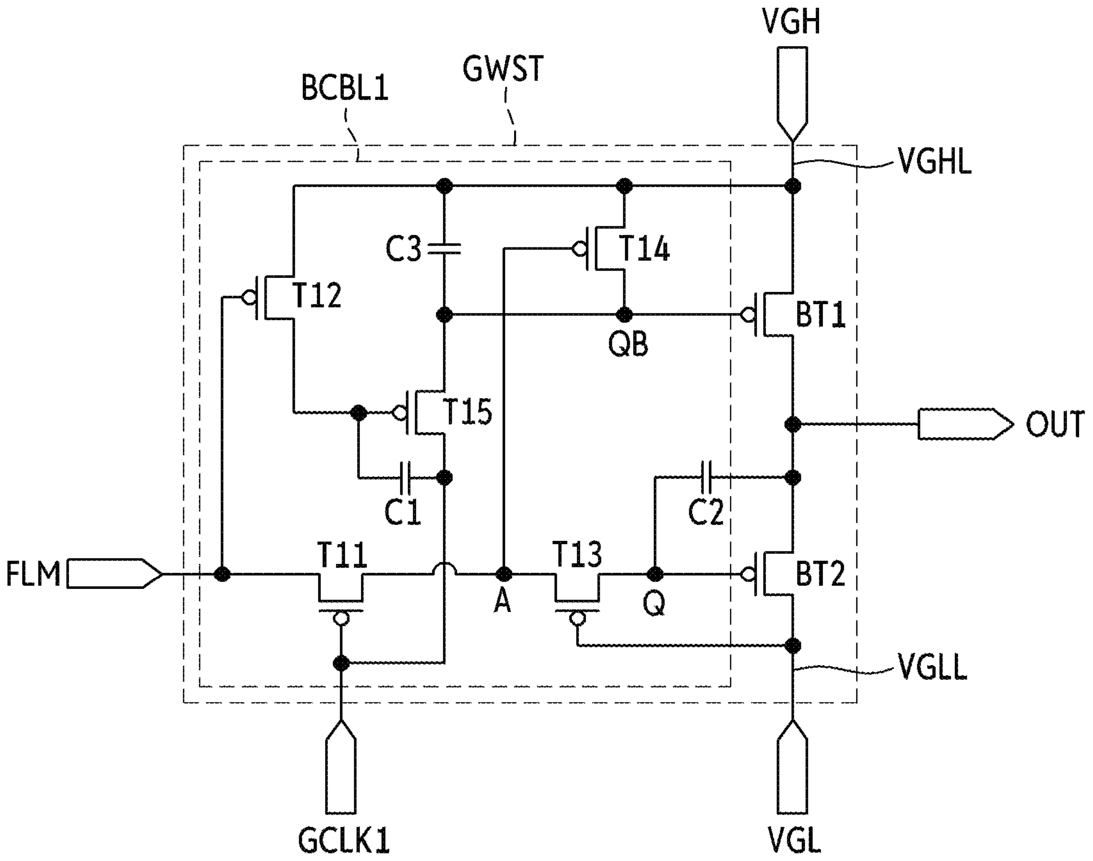
FIG. 14 is an equivalent circuit diagram showing the scan write stage of FIG. 12.
Figure 15:
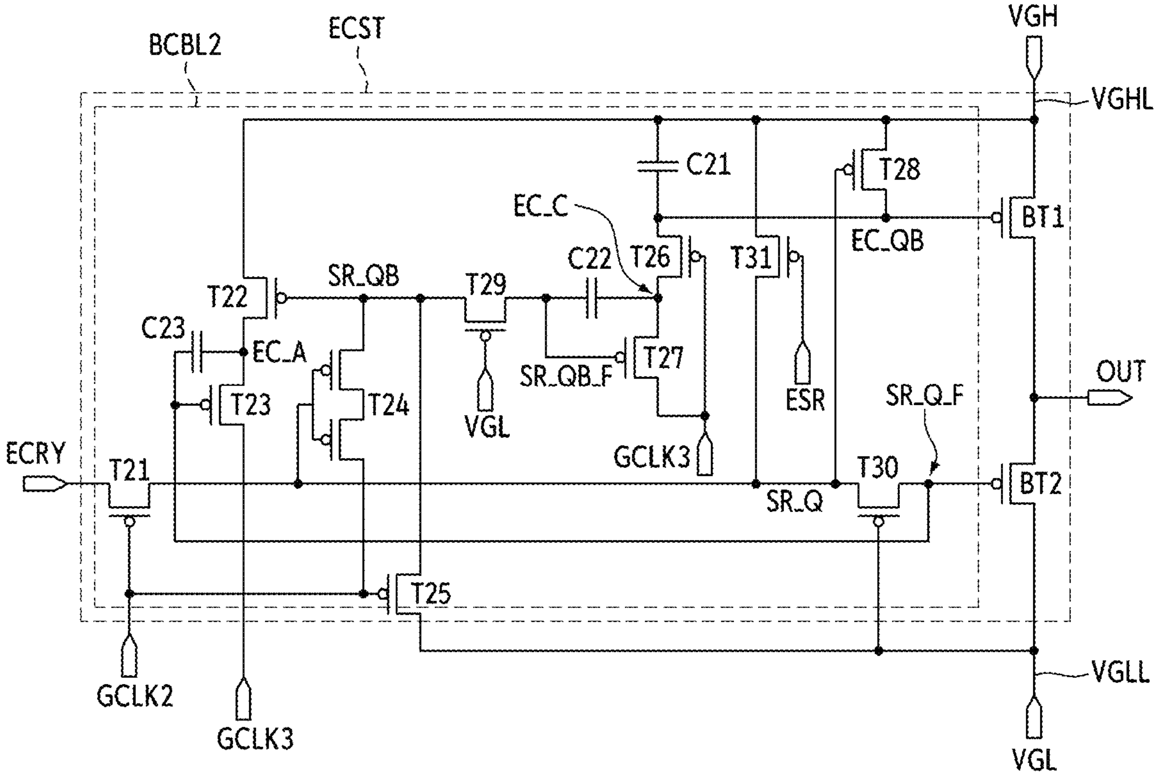
FIG. 15 is an equivalent circuit diagram showing the emission control stage of FIG. 12.

FIG. 13 is a block diagram showing one of the stages of FIG. 12. FIG. 14 is an equivalent circuit diagram showing the scan write stage of FIG. 12. FIG. 15 is an equivalent circuit diagram showing the emission control stage of FIG. 12.

Referring to FIG. 13, each of the stages ST may include a first buffer transistor BT1 and a second buffer transistor BT2 connected in series between a first gate level voltage line VGHL and a second gate level voltage line VGLL.

The first gate level voltage line VGHL transmits a first gate level voltage VGH.

The second gate level voltage line VGLL transmits a second gate level voltage VGL of a voltage level that is different from the first gate level voltage VGH.

An output terminal OUT of each of the stages ST may be electrically connected to the first buffer transistor BT1 and the second buffer transistor BT2.

Each of the stages ST may further include a buffer control unit BCBL that controls the first buffer transistor BT1 and the second buffer transistor BT2 based on a start signal FLM, or ECRY (see FIG. 15) and at least one gate control clock signal GCLK.

As illustrated in FIG. 14, a scan write stage GWST of the gate-driving circuit GTDR according to one or more embodiments may include the first buffer transistor BT1, the second buffer transistor BT2, and a first buffer control unit BCBL1 that controls the operation thereof.

The first buffer control unit BCBL1 may turn on one of the first buffer transistor BT1 and the second buffer transistor BT2 according to a scan write start signal FLM and a first gate clock signal GCLK1.

The first buffer control unit BCBL1 may include an eleventh transistor T11, a twelfth transistor T12, a thirteenth transistor T13, and a fourteenth transistor T14, and a first capacitor C1, a second capacitor C2, and a third capacitor C3.

The eleventh transistor T11 may be electrically connected between an input terminal to which the scan write start signal FLM is inputted and an A node A, and may be turned on according to the first gate clock signal GCLK1.

The twelfth transistor T12 may be electrically connected between the first gate level voltage line VGHL and the gate electrode of a fifteenth transistor T15, and may be turned on according to the first gate clock signal GCLK1.

The thirteenth transistor T13 may be electrically connected between the A node A and a Q node Q, and may be turned on according to the voltage difference between the second gate level voltage VGL and the A node A.

The fourteenth transistor T14 may be electrically connected between the first gate level voltage line VGHL and a QB node QB, and may be turned on according to the voltage difference between the first gate level voltage VGH and the A node A.

The fifteenth transistor T15 may be electrically connected between an input terminal to which the first gate clock signal GCLK1 is inputted and the QB node QB, and may be turned on according to the output of the twelfth transistor T12.

The first capacitor C1 may be electrically connected between the gate electrode of the fifteenth transistor T15 and the first electrode of the fifteenth transistor T15.

The second capacitor C2 may be electrically connected between the Q node Q and the second electrode of the second buffer transistor BT2.

The third capacitor C3 may be electrically connected between the first gate level voltage line VGHL and the QB node QB.

When the first gate clock signal GCLK1 is inputted to the scan write stage GWST, the scan write start signal FLM may be transmitted to the A node A through the eleventh transistor T11 that is turned on according to the first gate clock signal GCLK1.

When the voltage of the A node A fluctuates due to the scan write start signal FLM, the thirteenth transistor T13 is turned on, so that the Q node Q may be electrically connected to the A node A.

According to the voltage of the Q node Q, the charging voltage of the second capacitor C2 may be varied, so that the second buffer transistor BT2 may be turned on.

Accordingly, the second gate level voltage line VGLL is electrically connected to the output terminal OUT through the second buffer transistor BT2 that has been turned on, so that a signal of the second gate level voltage VGL may be outputted.

Meanwhile, when the scan write start signal FLM of a low voltage is inputted to the scan write stage GWST, the twelfth transistor T12 is turned on, so that the gate electrode of the fifteenth transistor T15 and the first capacitor C1 may be electrically connected to the first gate level voltage line VGHL.

Accordingly, the first capacitor C1 may be charged with a voltage corresponding to the first gate clock signal GCLK1 and the first gate level voltage VGH, and the fifteenth transistor T15 may be turned on according to the charging voltage of the first capacitor C1, so that the first gate clock signal GCLK1 may be transmitted to the QB node QB.

Accordingly, the first buffer transistor BT1 may be turned on according to the voltage of the QB node QB. Accordingly, the first gate level voltage line VGHL is electrically connected to the output terminal OUT through the first buffer transistor BT1 that has been turned on, so that a signal of the first gate level voltage VGH may be outputted.

As illustrated in FIG. 15, the emission control stage ECST of the gate-driving circuit GTDR according to one or more embodiments may include the first buffer transistor BT1, the second buffer transistor BT2, and a second buffer control unit BCBL2 that controls the operation thereof.

The second buffer control unit BCBL2 may turn on one of the first buffer transistor BT1 and the second buffer transistor BT2 based on an emission control start signal ECRY, a gate-on signal ESR, a second gate clock signal GCLK2, and a third gate clock signal GCLK3.

The second buffer control unit BCBL2 may include twenty-first to thirty-first transistors T21 to T31 and twenty-first to twenty-third capacitors C21 to C23.

The first buffer transistor BT1 of the emission control stage ECST is used to output the emission control signal EC (see FIG. 9) as the first gate level voltage VGH.

The first buffer transistor BT1 of the emission control stage ECST is electrically connected between the first gate level voltage line VGHL and the output terminal OUT of the emission control stage ECST.

The first buffer transistor BT1 of the emission control stage ECST may be turned on according to the voltage of an EC_QB node EC_QB. That is, when the EC_QB node EC_QB is at a low voltage, the first buffer transistor BT1 of the emission control stage ECST is turned on, so that the emission control signal EC of the first gate level voltage VGH may be outputted to the output terminal OUT.

The voltage of the EC_QB node EC_QB may be varied by the twenty-sixth transistor T26, the twenty-seventh transistor T27, and the twenty-eighth transistor T28.

The twenty-sixth transistor T26 and the twenty-seventh transistor T27 may be turned on according to the voltage of an SR_QB_F node SR_QB_F.

Because the SR_QB_F node SR_QB_F is connected to an SR_QB node SR_QB through the twenty-ninth transistor T29, the twenty-sixth transistor T26 and the twenty-seventh transistor T27 may be turned on according to the voltage of the SR_QB node SR_QB.

The voltage of the SR_QB node SR_QB may be varied by the twenty-fourth transistor T24 and the twenty-fifth transistor T25.

The second buffer transistor BT2 of the emission control stage ECST is used to output the emission control signal EC (see FIG. 9) as the second gate level voltage VGL.

The second buffer transistor BT2 of the emission control stage ECST may be electrically connected between the second gate level voltage line VGLL and the output terminal OUT of the emission control stage ECST.

The second buffer transistor BT2 of the emission control stage ECST may be turned on according to the voltage of an SR_Q_F node SR_Q_F. That is, when the SR_Q_F node SR_Q_F is at a low voltage, the second buffer transistor BT2 of the emission control stage ECST is turned on, so that the emission control signal EC of the second gate level voltage VGL may be outputted to the output terminal OUT. On the other hand, when the SR_Q_F node SR_Q_F is at a high voltage, the second buffer transistor BT2 of the emission control stage ECST is turned off.

The thirtieth transistor T30 may be electrically connected between the SR_Q_F node SR_Q_F and an SR_Q node SR_Q.

Because the thirtieth transistor T30 is in a state of being turned on by the second gate level voltage VGL, the potential of the SR_Q_F node SR_Q_F may be maintained equal to the potential of the SR_Q node SR_Q.

The twenty-eighth transistor T28 may be electrically connected between the first gate level voltage line VGHL and the EC_QB node EC_QB, and may be turned on according to the voltage of the SR_Q node SR_Q. That is, when the SR_Q node SR_Q is at a low voltage, the twenty-eighth transistor T28 is turned on, so that the first gate level voltage VGH may be transmitted to the EC_QB node EC_QB.

The twenty-first capacitor C21 may store the voltage of the EC_QB node EC_QB.

The twenty-sixth transistor T26 may be turned on according to the third gate clock signal GCLK3 and may be electrically connected between the EC_QB node EC_QB and an EC_C node EC_C.

The twenty-seventh transistor T27 may be turned on according to the voltage of the SR_QB_F node SR_QB_F and may be electrically connected between an input terminal to which the third gate clock signal GCLK3 is applied and the EC_C node EC_C.

When the SR_QB node SR_QB and the third gate clock signal GCLK3 are at a low voltage, the EC_QB node EC_QB may be changed to a low voltage of the third gate clock signal GCLK3 by the twenty-sixth transistor T26 and the twenty-seventh transistor T27.

The twenty-first transistor T21 is turned on by the second gate clock signal GCLK2, and is electrically connected between an input terminal to which the emission control start signal ECRY is applied and the SR_Q node SR_Q. When the second gate clock signal GCLK2 is at a low voltage, the twenty-first transistor T21 is turned on, so that the emission control start signal ECRY may be transmitted to the SR_Q node SR_Q.

The thirty-first transistor T31 is maintained in a turned-on state by the gate-on signal ESR, so that the potential of the SR_Q node SR_Q may be maintained at the first gate level voltage VGH.

The twenty-second transistor T22 may be turned on according to the potential of the SR_QB node SR_QB, and may be electrically connected between the first gate level voltage line VGHL and an EC_A node EC_A.

The twenty-third transistor T23 may be turned on according to the potential of the SR_Q_F node SR_Q_F, and may be electrically connected between an input terminal to which the third gate clock signal GCLK3 is applied and the EC_A node EC_A.

The twenty-fourth transistor T24 may be turned on according to the potential of the SR_Q node SR_Q, and may be electrically connected between an input terminal to which the second gate clock signal GCLK2 is applied and the SR_QB node SR_QB. The twenty-fourth transistor T24 may include two sub-transistors connected in series.

The twenty-fifth transistor T25 may be turned on according to the second gate clock signal GCLK2, and may be electrically connected between the second gate level voltage line VGLL and the SR_QB node SR_QB.

However, the first buffer control unit BCBL1 illustrated in FIG. 14 and the second buffer control unit BCBL2 illustrated in FIG. 15 are merely examples, and the gate-driving circuit GTDR according to one or more embodiments is not limited to the illustrations in FIGS. 14 and 15.

Because each of the scan initialization stage GIST and the bias control stage GBST is similar to the scan write stage GWST of FIG. 14 or the emission control stage ECST of FIG. 15, redundant description will be omitted below.

Figure 16:
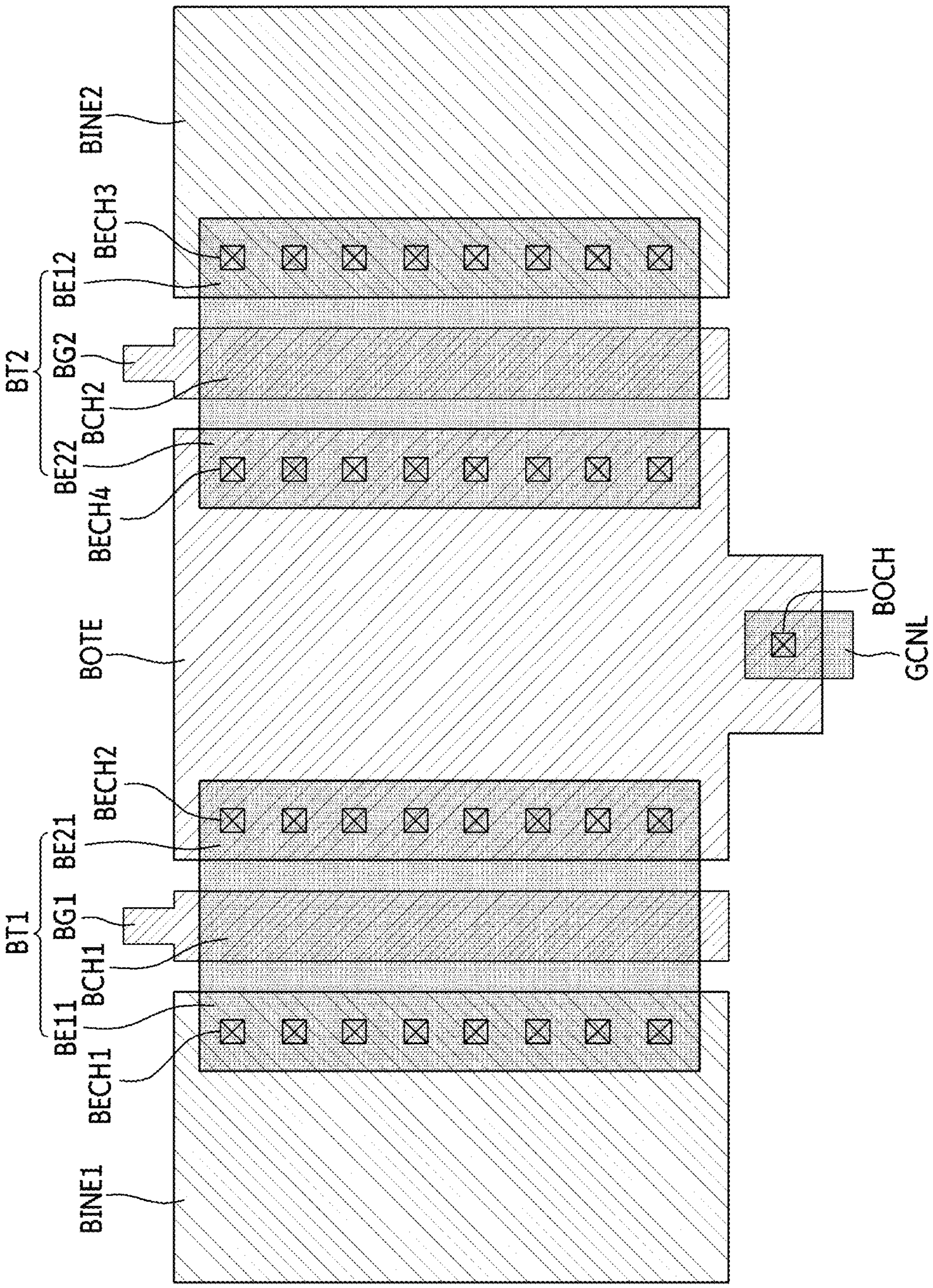
FIG. 16 is a plan view illustrating the first buffer transistor and the second buffer transistor of FIG. 13 located in a plurality of non-folding areas.
Figure 17:
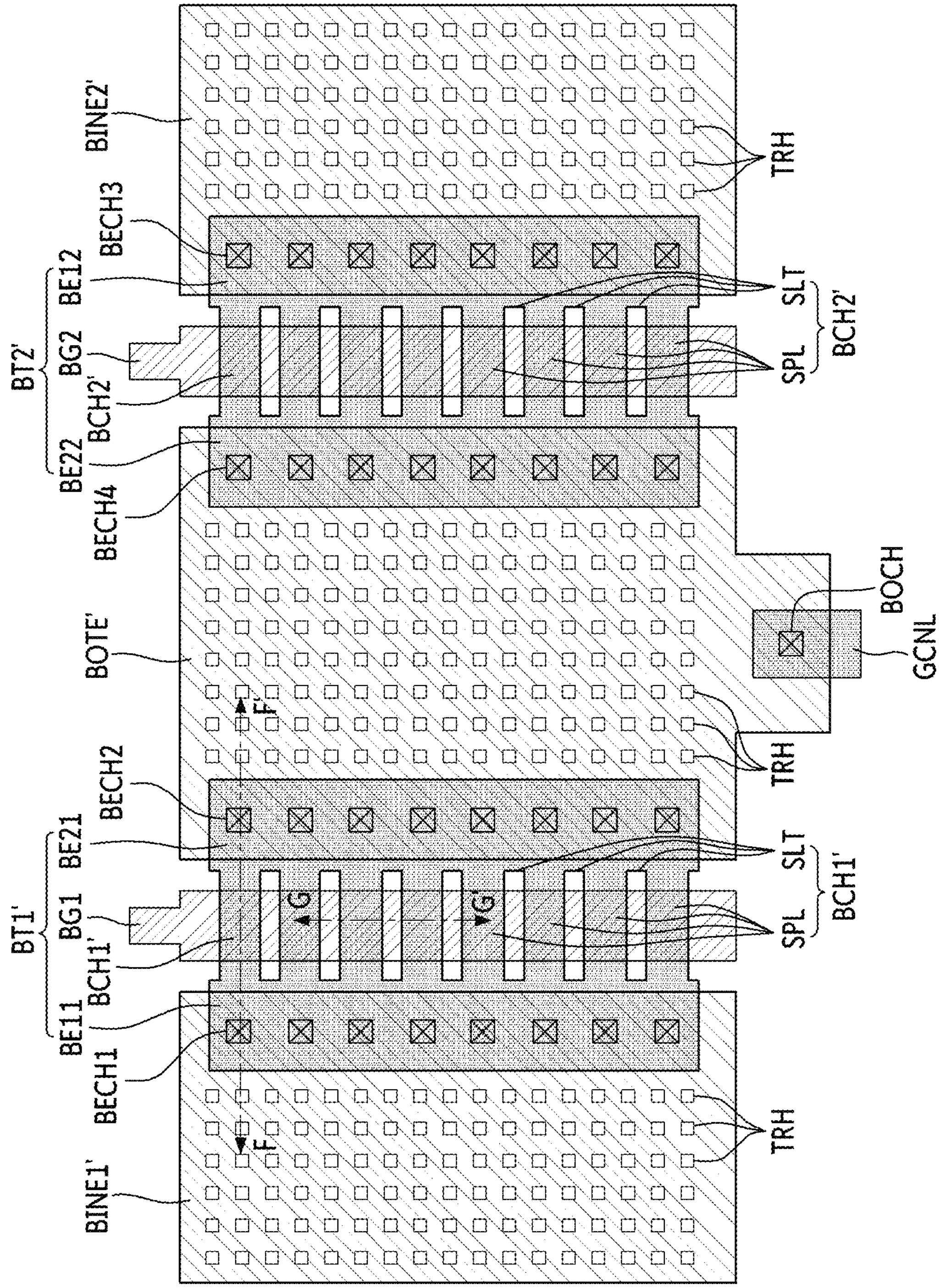
FIG. 17 is a plan view illustrating the first buffer transistor and the second buffer transistor of FIG. 13 located in at least one folding area.
Figure 18:
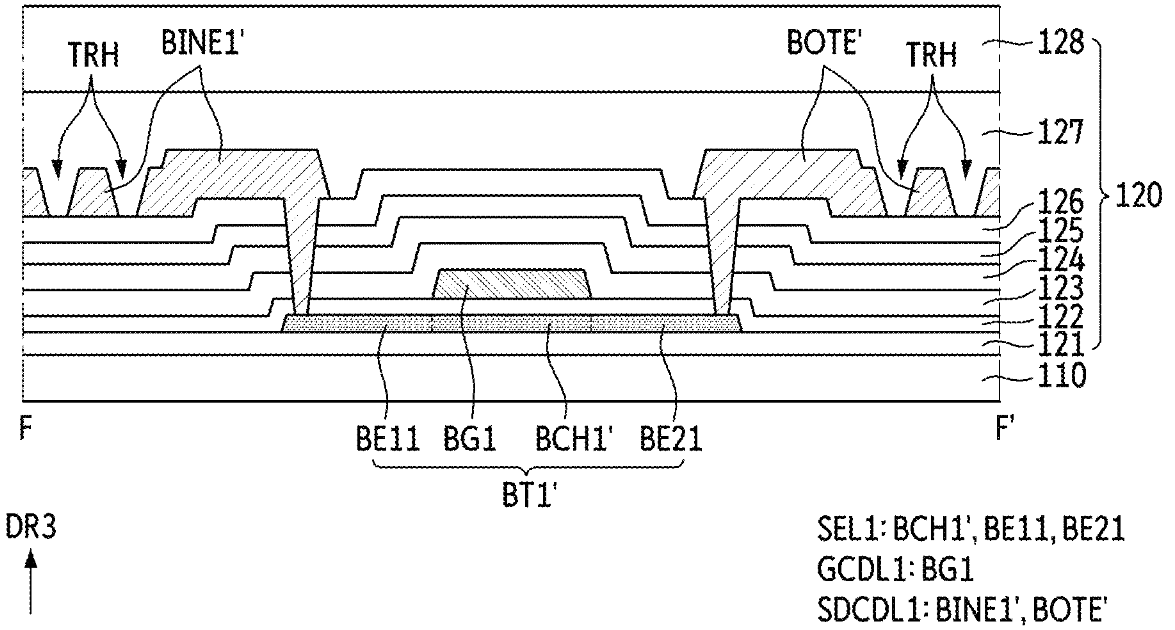
FIG. 18 is a cross-sectional view taken along the line F-F' of FIG. 17.
Figure 19:
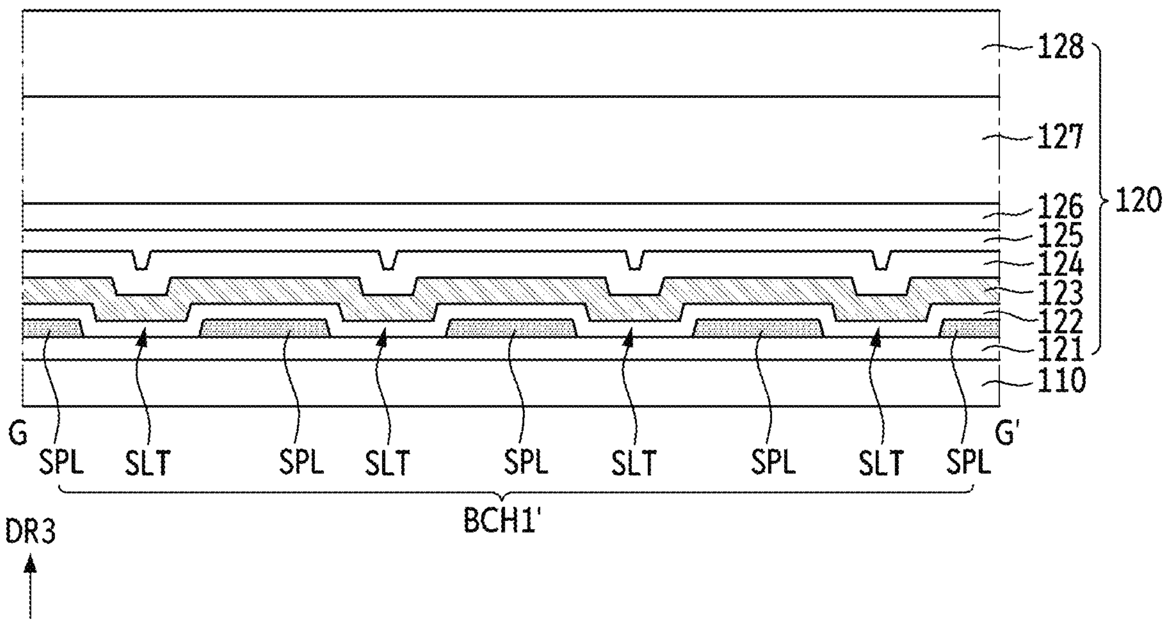
FIG. 19 is a cross-sectional view taken along the line G-G' of FIG. 17.

FIG. 16 is a plan view illustrating the first buffer transistor and the second buffer transistor of FIG. 13 located in a plurality of non-folding areas. FIG. 17 is a plan view illustrating the first buffer transistor and the second buffer transistor of FIG. 13 located in at least one folding area. FIG. 18 is a cross-sectional view taken along the line F-F' of FIG. 17. FIG. 19 is a cross-sectional view taken along the line G-G' of FIG. 17.

Referring to FIGS. 16, 17, and 18, the first buffer transistor BT1 and the second buffer transistor BT2 may respectively include channel portions BCH1 and BCH2, first electrode portions BE11 and BE12 respectively connected to one sides of the channel portions BCH1 and BCH2, second electrode portions BE21 and BE22 respectively connected to the other sides of the channel portions BCH1 and BCH2, and gate electrodes BG1 and BG2 located on an insulating layer covering the channel portions BCH1 and BCH2 and overlapping the channel portion BCH1 and BCH2.

Each of the stages ST (see FIG. 13) may include a first buffer input electrode BINE1 electrically connected to the first gate level voltage line VGHL (see FIG. 13) and the first electrode portion BE11 of the first buffer transistor BT1, a second buffer input electrode BINE2 electrically connected to the second gate level voltage line VGLL (see FIG. 13) and the first electrode portion BE12 of the second buffer transistor BT2, and a buffer output electrode BOTE electrically connected between the second electrode portion BE21 of the first buffer transistor BT1 and the second electrode portion BE22 of the second buffer transistor BT2 and at least one gate line GL (see FIG. 12).

The first buffer input electrode BINE1 may be electrically connected to the first electrode portion BE11 of the first buffer transistor BT1 through at least one first buffer electrode connection hole BECH1.

The buffer output electrode BOTE may be electrically connected to the second electrode portion BE21 of the first buffer transistor BT1 through at least one second buffer electrode connection hole BECH2.

The second buffer input electrode BINE2 may be electrically connected to the first electrode portion BE12 of the second buffer transistor BT2 through at least one third buffer electrode connection hole BECH3.

The buffer output electrode BOTE may be electrically connected to the second electrode portion BE22 of the second buffer transistor BT2 through at least one fourth buffer electrode connection hole BECH4.

The gate lines GL may extend to the gate-driving circuit GTDR (see FIG. 11) and may be electrically connected to the buffer output electrodes BOTE of the stages ST.

Alternatively, the gate-driving circuit GTDR (see FIG. 11) may include gate connection lines GCNL electrically connecting the buffer output electrodes BOTE of the stages ST to the gate lines GL. The gate connection lines GCNL may be electrically connected to the buffer output electrodes BOTE of the stages ST through buffer output connection holes BOCH.

Meanwhile, according to one or more embodiments, because the non-display area NDA includes at least one folding non-display area FDNDA overlapping at least one folding area FDA, some of the gate-driving circuits GTDR may be located in at least one folding non-display area FDNDA.

However, to ensure reliability for the output of each of the stages ST of the gate-driving circuit GTDR, the first buffer transistor BT1, the second buffer transistor BT2, the first buffer input electrode BINE1, the second buffer input electrode BINE2, and the buffer output electrode BOTE of each of the stages ST of the gate-driving circuit GTDR are located with relatively large widths, and thus may be vulnerable to bending stress.

Therefore, according to one or more embodiments, a first buffer transistor BT1' (see FIG. 17) and a second buffer transistor BT2' (see FIG. 17) located in at least one folding area FDA of the gate-driving circuit GTDR may have shapes that may reduce the influence of bending stress due to transformation, unlike the first buffer transistor BT1 (see FIG. 16) and the second buffer transistor BT2 (see FIG. 16) located in the plurality of non-folding areas NFA.

As illustrated in FIG. 17, according to one or more embodiments, respective channel portions BCH1' and BCH2' of the first buffer transistor BT1' and the second buffer transistor BT2' located in at least one folding area FDA of the gate-driving circuit GTDR may include a comb shape formed by one or more slits SLT.

In the respective channel portions BCH1' and BCH2' of the first buffer transistor BT1' and the second buffer transistor BT2' located in at least one folding area FDA, one or more slits SLT may extend in a direction in which the first electrode portions BE11 and BE12 and the second electrode portions BE21 and BE22 face each other, and may be arranged in parallel with each other in a direction crossing the extension direction.

Each of the first buffer transistor BT1' and the second buffer transistor BT2' located in at least one folding area FDA may include two or more splits SPL located on respective sides of one or more slits SLT. In other words, one or more slits SLT may be located between two or more splits SPL.

Further, the comb shape may be referred to as a shape in which two or more splits SPL are arranged.

In this way, the respective channel portions BCH1' and BCH2' of the first buffer transistor BT1' and the second buffer transistor BT2' located in at least one folding area FDA may be located in a comb shape including one or more slits SLT, and thus may have reduced bending stress as compared with a planar shape that does not include one or more slits SLT. Accordingly, the influence of bending stress due to the transformation of at least one folding area FDA may be reduced on the respective channel portions BCH1' and BCH2' of the first buffer transistor BT1' and the second buffer transistor BT2' located in at least one folding area FDA. That is, because the respective channel portions BCH1' and BCH2' of the first buffer transistor BT1' and the second buffer transistor BT2' located in at least one folding area FDA have the reduced bending stress due to a comb shape, although at least one folding area FDA is repeatedly transformed, the lifespan of the first buffer transistor BT1' and the second buffer transistor BT2' may be improved.

In one or more embodiments, the width of each of the two or more splits SPL may be greater than the width of each of one or more slits SLT. For example, when the width of each of two or more splits SPL is about 4 μm, the width of each of one or more slits SLT may be about 3 μm.

In this way, the respective channel portions BCH1' and BCH2' of the first buffer transistor BT1' and the second buffer transistor BT2' located in at least one folding area FDA may have a comb shape, while the amount of change in carrier mobility due to one or more slits SLT may be reduced.

In addition, according to one or more embodiments, a first buffer input electrode BINE1' (see FIG. 17), a second buffer input electrode BINE2' (see FIG. 17), and a buffer output electrode BOTE' (see FIG. 17) located in at least one folding area FDA of the gate-driving circuit GTDR may have a shape capable of reducing the influence of bending stress due to transformation, unlike the first buffer input electrode BINE1 (see FIG. 16), the second buffer input electrode BINE2 (see FIG. 16), and the buffer output electrode BOTE (see FIG. 16) located in the plurality of non-folding areas NFA.

As illustrated in FIG. 17, each of the first buffer input electrode BINE1', the second buffer input electrode BINE2', and the buffer output electrode BOTE' located in at least one folding area FDA of the gate-driving circuit GTDR may include a mesh shape formed by two or more through grooves TRH arranged in parallel with each other.

In this way, each of the first buffer input electrode BINE1', the second buffer input electrode BINE2', and the buffer output electrode BOTE' located in at least one folding area FDA may be located in a mesh shape including two or more through grooves TRH, and thus may have the reduced bending stress as compared with a planar shape that does not include the through grooves TRH. Accordingly, the influence of bending stress due to the transformation of at least one folding area FDA may be reduced on the first buffer input electrode BINE1', the second buffer input electrode BINE2', and the buffer output electrode BOTE' located in at least one folding area FDA. That is, because the first buffer input electrode BINE1', the second buffer input electrode BINE2', and the buffer output electrode BOTE' located in at least one folding area FDA have the reduced bending stress due to a mesh shape, although at least one folding area FDA is repeatedly transformed, breakage or damage of the first buffer input electrode BINE1', the second buffer input electrode BINE2', and the buffer output electrode BOTE' may be delayed.

Referring to FIG. 18, the channel portion BCH1', or BCH1 (see FIG. 16), the first electrode portion BE11, and the second electrode portion BE21 of the first buffer transistor BT1', or BT1 (see FIG. 16) of each of the stages ST (see FIG. 13) may be located in the first semiconductor layer SEL1 on the substrate 110.

The gate electrode BG1 of the first buffer transistor BT1', or BT1 (see FIG. 16) of each of the stages ST (see FIG. 13) may be located in the first gate conductive layer GCDL1 on the first gate-insulating layer 122 covering the first semiconductor layer SEL1.

The second buffer transistor BT2 (see FIG. 16) or BT2' (see FIG. 17) of each of the stages ST is substantially the same as the first buffer transistor BT1' (see FIG. 18) or BT1 (see FIG. 16), so that redundant description will be omitted below.

Each of the first buffer input electrode BINE1' or BINE1 (see FIG. 16), the second buffer input electrode BINE2' or BINE2 (see FIG. 16) and the buffer output electrode BOTE' or BOTE (see FIG. 16) provided in each of the stages ST may be located in the first source-drain conductive layer SDCDL1 on the second interlayer insulating layer 126 or the second source-drain conductive layer SDCDL2 (see FIG. 10) on the first planarization layer 127.

For example, as illustrated in FIG. 18, each of the first buffer input electrode BINE1', and the buffer output electrode BOTE' may be located in the first source-drain conductive layer SDCDL1.

According to one or more embodiments, each of the first buffer input electrode BINE1', the second buffer input electrode BINE2' (see FIG. 17), and the buffer output electrode BOTE' located in at least one folding area FDA may include a mesh shape formed by two or more through grooves TRH arranged in parallel with each other.

In the first buffer input electrode BINE1', two or more through grooves TRH may penetrate the first buffer input electrode BINE1'.

In the buffer output electrode BOTE', two or more through grooves TRH may penetrate the buffer output electrode BOTE'.

Likewise, in the second buffer input electrode BINE2' (see FIG. 17), two or more through grooves TRH may penetrate the second buffer input electrode BINE2'.

According to one or more embodiments, the respective channel portions BCH1' and BCH2' (see FIG. 17) of the first buffer transistor BT1' and the second buffer transistor BT2' (see FIG. 17) located in at least one folding area FDA may be located in the first semiconductor layer SEL1 (see FIG. 10), and may be located in a comb shape including one or more slits SLT and two or more splits SPL located on both sides thereof.

As illustrated in FIG. 19, in the channel portion BCH1' of the first buffer transistor BT1' located in at least one folding area FDA, each of one or more slits SLT may penetrate the channel portion BCH1'.

Likewise, in the channel portion BCH2' (see FIG. 17) of the second buffer transistor BT2' located in at least one folding area FDA, each of one or more slits SLT may penetrate the channel portion BCH2' (see FIG. 17).

Figure 20:
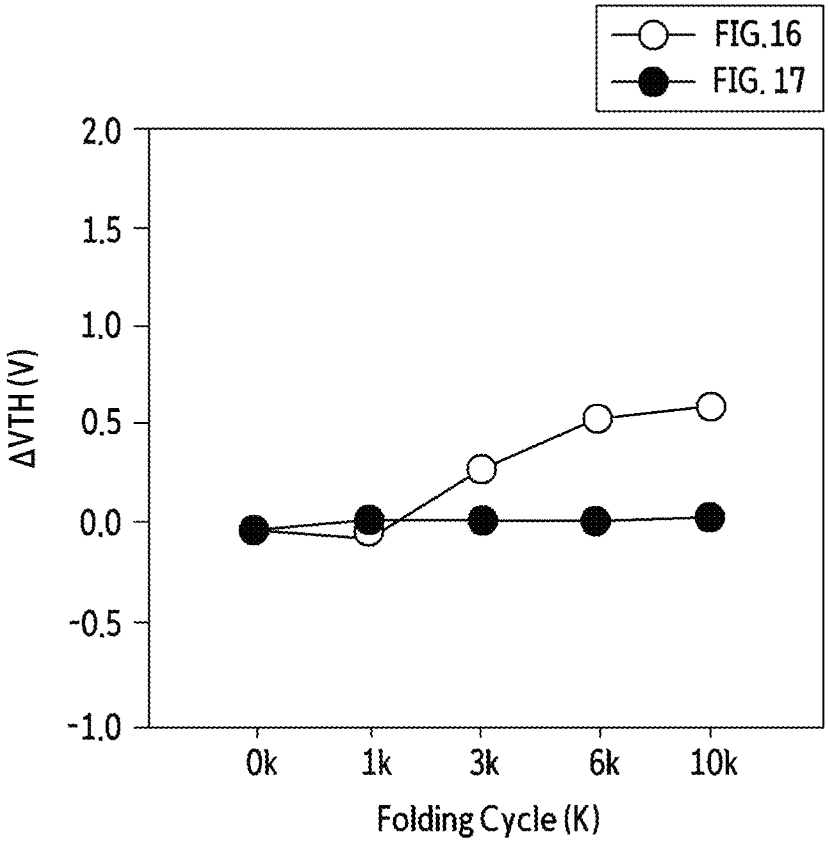
FIG. 20 is a graph illustrating the simulation results for the variation amount of the threshold voltage of the transistor of FIG. 16 and the variation amount of the threshold voltage of the transistor of FIG. 17 according to the number of times transformation is performed by in-folding.
Figure 21:
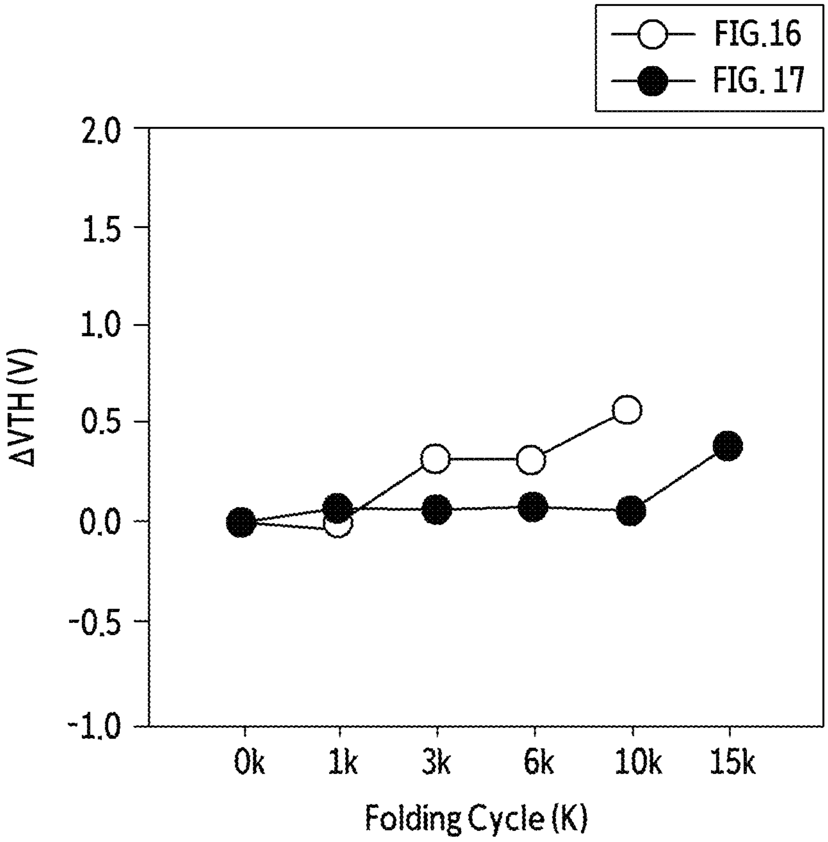
FIG. 21 is a graph illustrating the simulation results for the variation amount of the threshold voltage of the transistor of FIG. 16 and the variation amount of the threshold voltage of the transistor of FIG. 17 according to the number of times transformation is performed by out-folding.

FIG. 20 is a graph illustrating the simulation results for the variation amount of the threshold voltage of the transistor of FIG. 16 and the variation amount of the threshold voltage of the transistor of FIG. 17 according to the number of times transformation is performed by in-folding. FIG. 21 is a graph illustrating the simulation results for the variation amount of the threshold voltage of the transistor of FIG. 16 and the variation amount of the threshold voltage of the transistor of FIG. 17 according to the number of times transformation is performed by out-folding.

Referring to FIG. 20, in the case of the first and second buffer transistors BT1 and BT2 (see FIG. 16) including the planar-shaped channel portions BCH1 and BCH2 (see FIG. 16) that do not include one or more slits SLT (see FIG. 17), and that are electrically connected to the planar-shaped electrodes BINE1, BINE2, and BOTE (see FIG. 16), it may be confirmed that as the number of times transformation is performed by in-folding (folding cycle) increases to 1000 times (1 k), 3000 times (3 k), 6000 times (6 k), and 10000 times (10 k), a variation amount ΔVTH of the threshold voltage gradually increases and exceeds about 0.5 V.

On the other hand, in the case of the first and second buffer transistors BT1' and BT2' (see FIG. 17) including the comb-shaped channel portions BCH1' and BCH2' (see FIG. 17) that include one or more slits SLT (see FIG. 17), and that are electrically connected to the mesh-shaped electrodes BINE1', BINE2', and BOTE' (see FIG. 17), it may be confirmed that the variation amount ΔVTH of the threshold voltage is about 0 V, even though the number of times (folding cycle) transformation is performed by in-folding increases to 1000 times (1 k), 3000 times (3 k), 6000 times (6 k), and 10000 times (10 k).

Further, referring to FIG. 21, in the case of the first and second buffer transistors BT1 and BT2 (see FIG. 16) including the planar-shaped channel portions BCH1 and BCH2 (see FIG. 16) that do not include one or more slits SLT (see FIG. 17), and that are electrically connected to the planar-shaped electrodes BINE1, BINE2, and BOTE (see FIG. 16), it may be confirmed that as the number of times (folding cycle) transformation is performed by out-folding increases to 1000 times (1 k), 3000 times (3 k), 6000 times (6 k), and 10000 times (10 k), a variation amount ΔVTH of the threshold voltage gradually increases and exceeds about 0.5 V.

On the other hand, in the case of the first and second buffer transistors BT1' and BT2' (see FIG. 17) including the comb-shaped channel portions BCH1' and BCH2' (see FIG. 17) that include one or more slits SLT (see FIG. 17), and that are electrically connected to the mesh-shaped electrodes BINE1', BINE2', and BOTE' (see FIG. 17), it may be confirmed that the variation amount ΔVTH of the threshold voltage is about 0 V, even though the number of times (folding cycle) transformation is performed by out-folding increases to 1000 times (1 k), 3000 times (3 k), 6000 times (6 k), and 10000 times (10 k). Further, it may be confirmed that although the number of times (folding cycle) transformation is performed by out-folding increases to 15,000 times (15 k), the variation amount ΔVTH of the threshold voltage is less than about 0.5 V.

As described above, according to one or more embodiments, the first buffer transistor BT1' (see FIG. 17) and the second buffer transistor BT2' (see FIG. 17) located in at least one folding area FDA may include the comb-shaped channel portions BCH1' and BCH2' (see FIG. 17) formed by one or more slits SLT, and each of the first buffer input electrode BINE1', the second buffer input electrode BINE2', and the buffer output electrode BOTE' located in at least one folding area FDA may include a mesh shape formed by two or more through grooves TRH arranged in parallel with each other. Accordingly, although bending stress due to transformation is repeatedly applied to at least one folding area FDA, the output characteristics of some stages located in at least one folding area FDA of the gate-driving circuit GTDR (see FIG. 11) may be maintained.

According to one or more other embodiments, as in the case of at least one folding area FDA, the first buffer transistor BT1' and the second buffer transistor BT2' including the comb-shaped channel portions BCH1' and BCH2' may also be located in the plurality of non-folding areas NFA. That is, the first buffer transistor BT1 and the second buffer transistor BT2 of the entire stages ST may include the comb-shaped channel portions BCH1 and BCH2.

According to one or more other embodiments, as in the case of at least one folding area FDA, the first buffer input electrode BINE1', the second buffer input electrode BINE2', and the buffer output electrode BOTE' may also be located in a mesh shape in the plurality of non-folding areas NFA.

In this way, because the heat dissipation characteristics of the output terminals OUT (see FIG. 13) of the entire stages ST may become similar, the uniformity of the output characteristics of the entire stages ST may be improved.

Meanwhile, FIGS. 1 and 2 illustrate the display device 10 including two non-folding areas NFA facing each other in the second direction DR2 and one folding area FDA located therebetween. However, the display device 10 is not limited to the illustrations of FIGS. 1 and 2.

Figure 22:
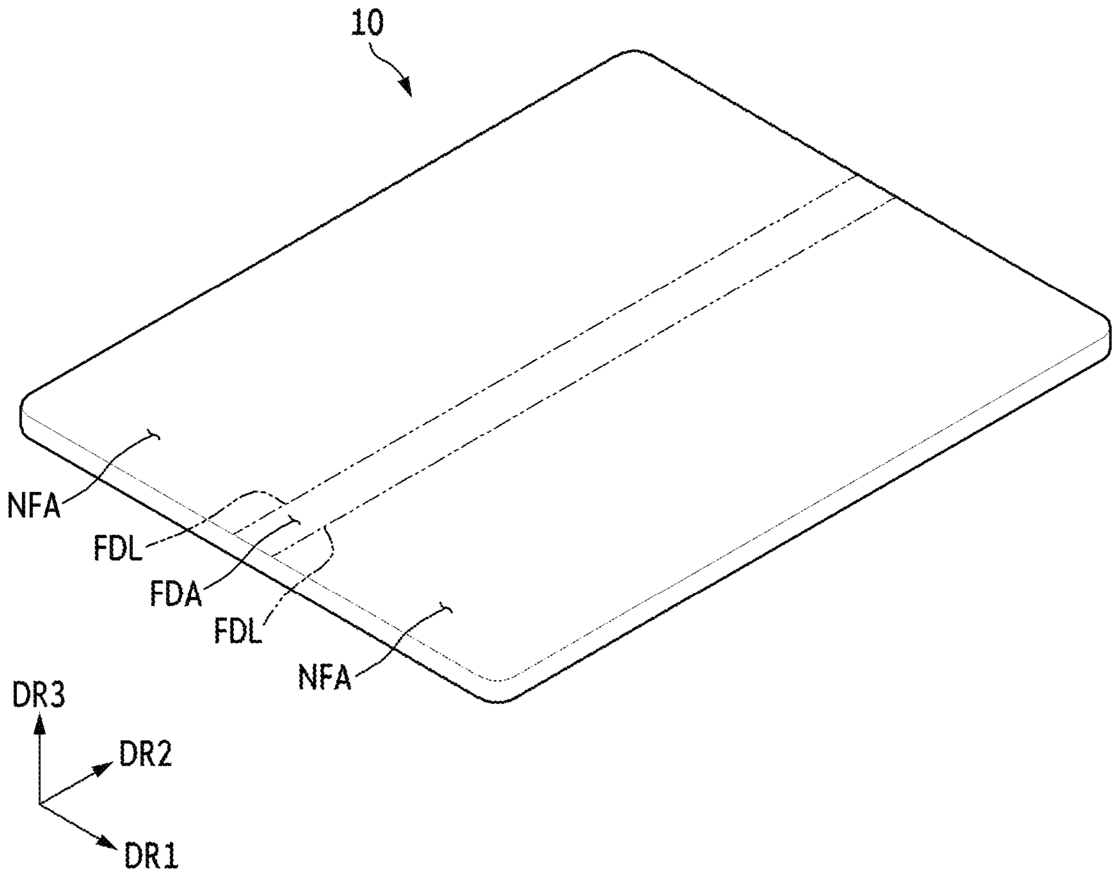
FIGS. 22 and 23 are perspective views showing an unfolded state and a folded state of a display device according to one or more embodiments.
Figure 23:
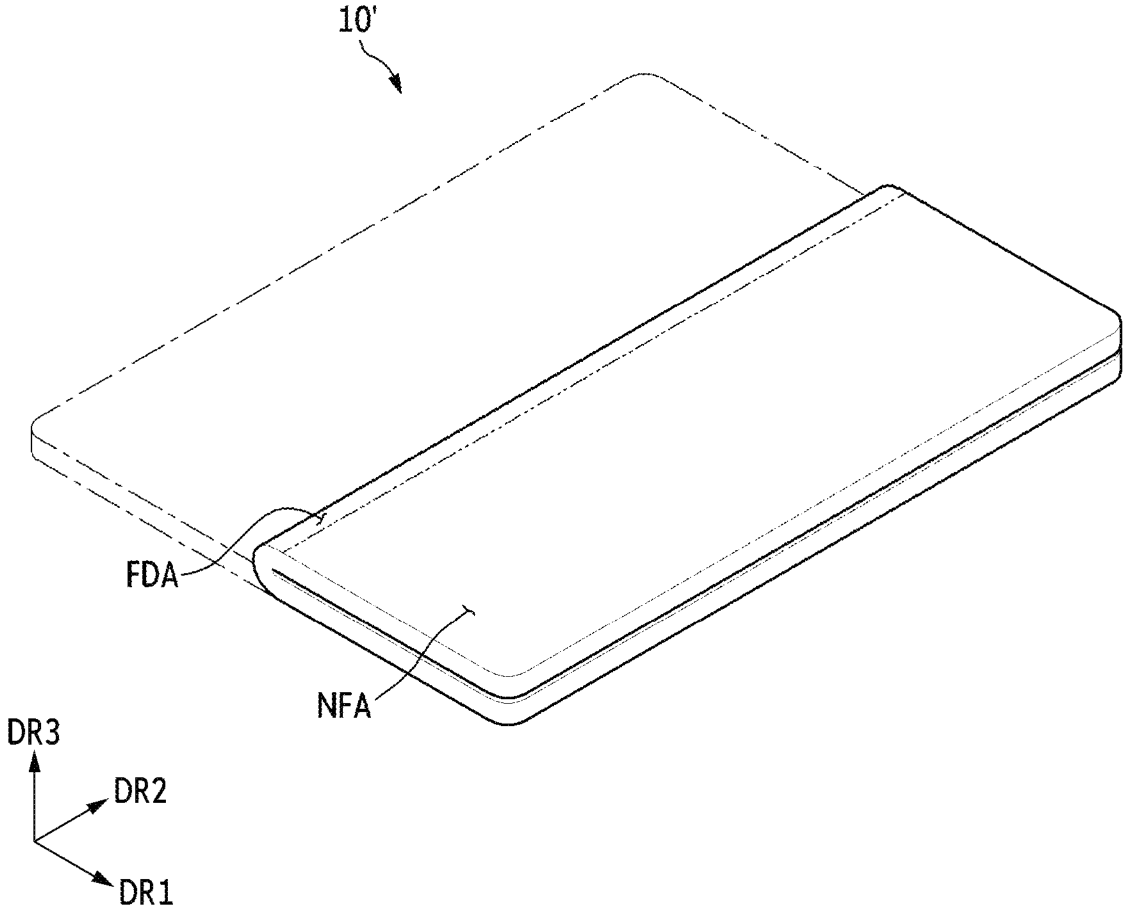
Figure 24:
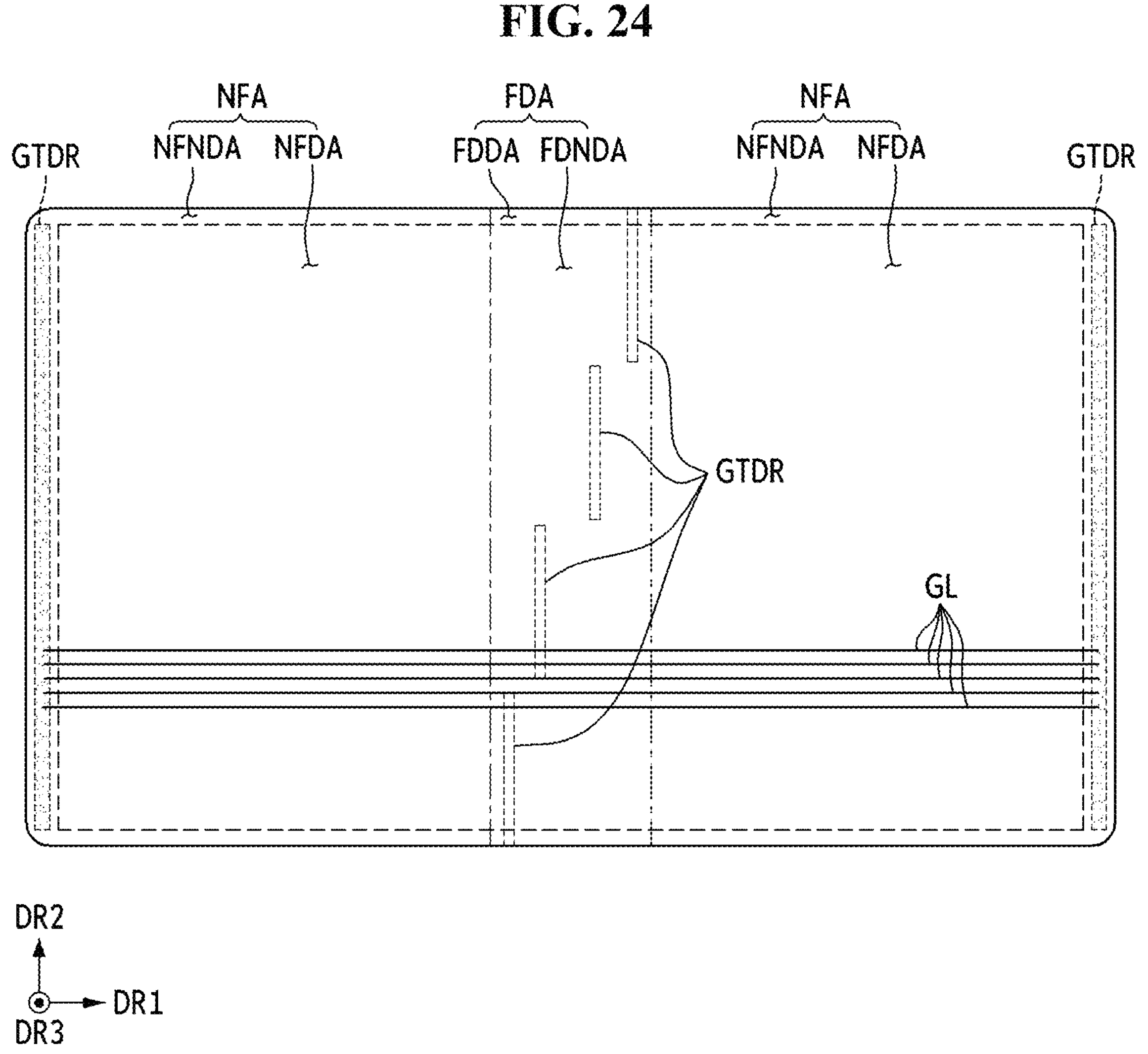
FIG. 24 is a plan view showing the gate-driving circuit of the display device illustrated in FIGS. 22 and 23.

FIGS. 22 and 23 are perspective views showing an unfolded state and a folded state of a display device according to one or more embodiments. FIG. 24 is a plan view showing the gate-driving circuit of the display device illustrated in FIGS. 22 and 23.

The display device 10 of one or more embodiments illustrated in FIGS. 22 and 23 may include two non-folding areas NFA arranged in the first direction DR1, and one folding area FDA located therebetween.

Two folding lines FDL, which are boundaries between each of two non-folding areas NFA and one folding area FDA, may extend in the second direction DR2.

Referring to FIG. 24, the gate-driving circuit GTDR of the display device 10 according to one or more embodiments of FIGS. 22 and 23 may be located in the non-folding non-display area NFNDA, as well as the folding non-display area FDNDA and the folding display area FDDA.

In the folding display area FDDA, the gate-driving circuits GTDR may be located in a distributed manner.

Figure 25:
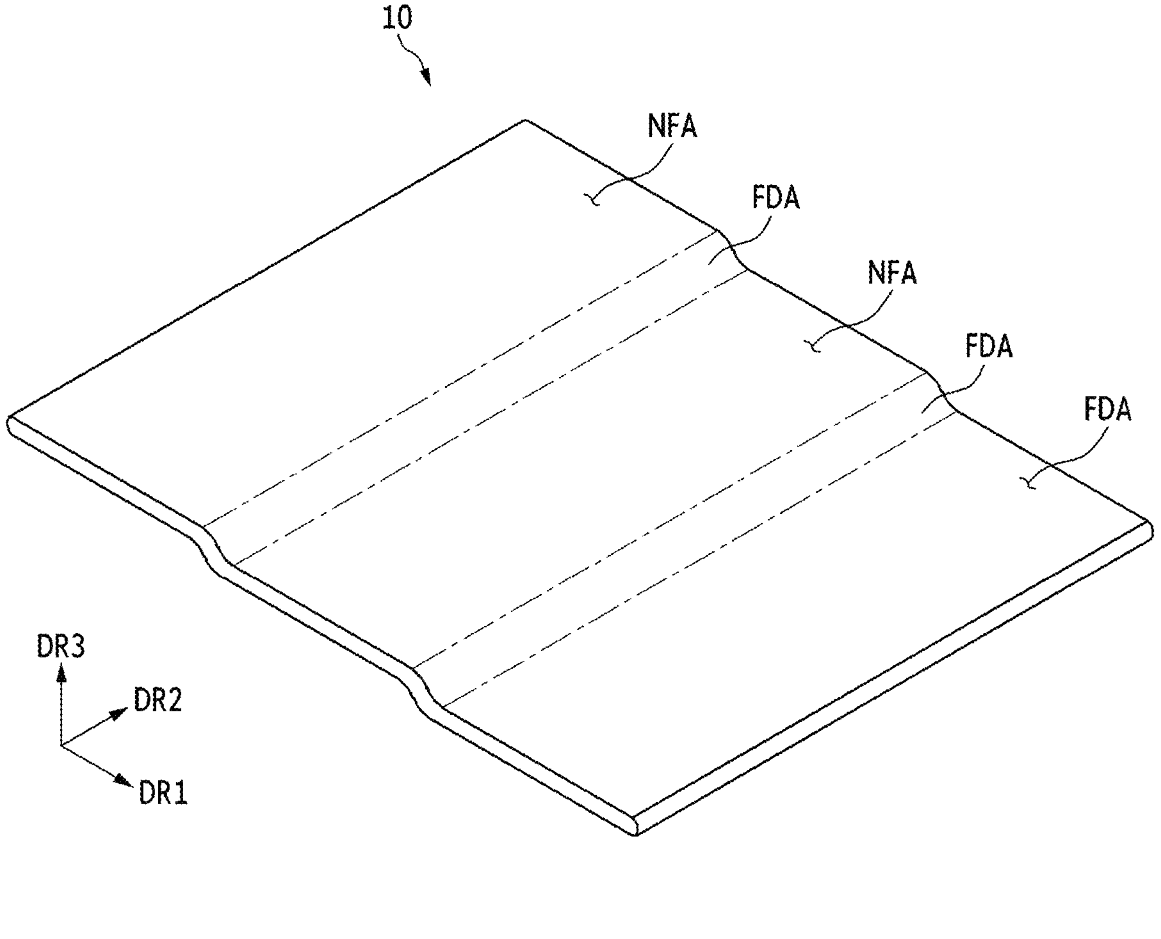
FIGS. 25 and 26 are perspective views showing an unfolded state and a folded state of a display device according to one or more embodiments.
Figure 26:
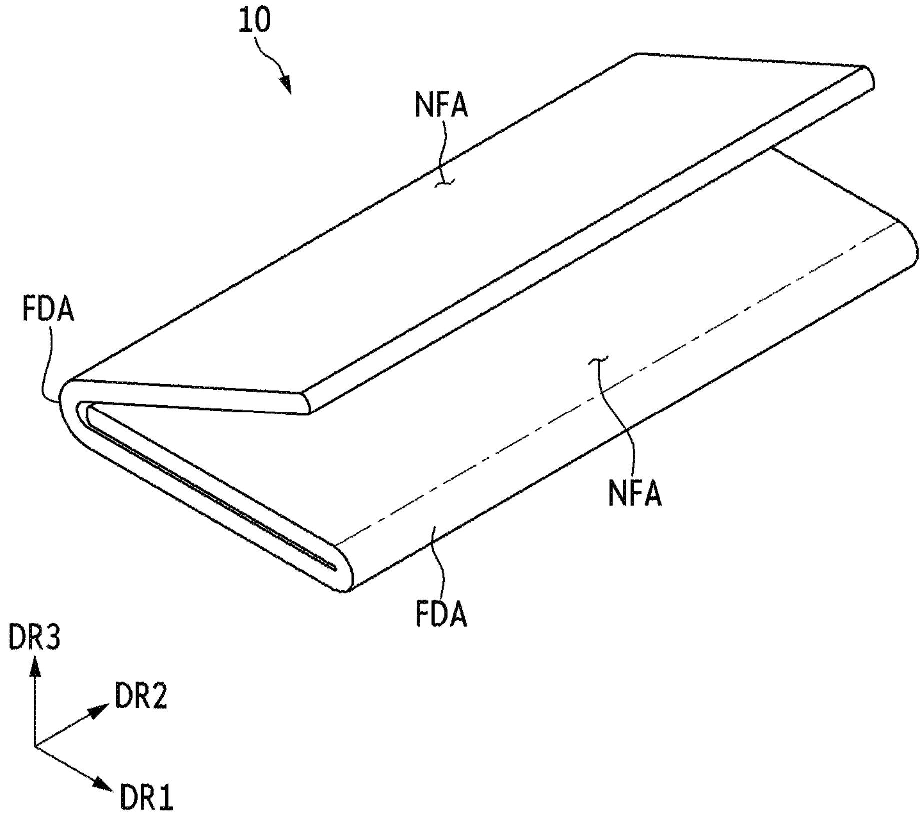

FIGS. 25 and 26 are perspective views showing an unfolded state and a folded state of a display device according to one or more embodiments.

The display device 10 of one or more embodiments illustrated in FIGS. 25 and 26 may include three non-folding areas NFA arranged in the first direction DR1, and two folding areas FDA located therebetween.

As illustrated in FIG. 26, one of the two folding areas FDA may be transformed by in-folding, and the other may be transformed by out-folding.

The display device according to one or more embodiments of the present disclosure can be applied to various electronic devices. The electronic device according to the one or more embodiments of the present disclosure includes the display device described above, and may further include modules or devices having additional functions in addition to the display device.

Figure 27:
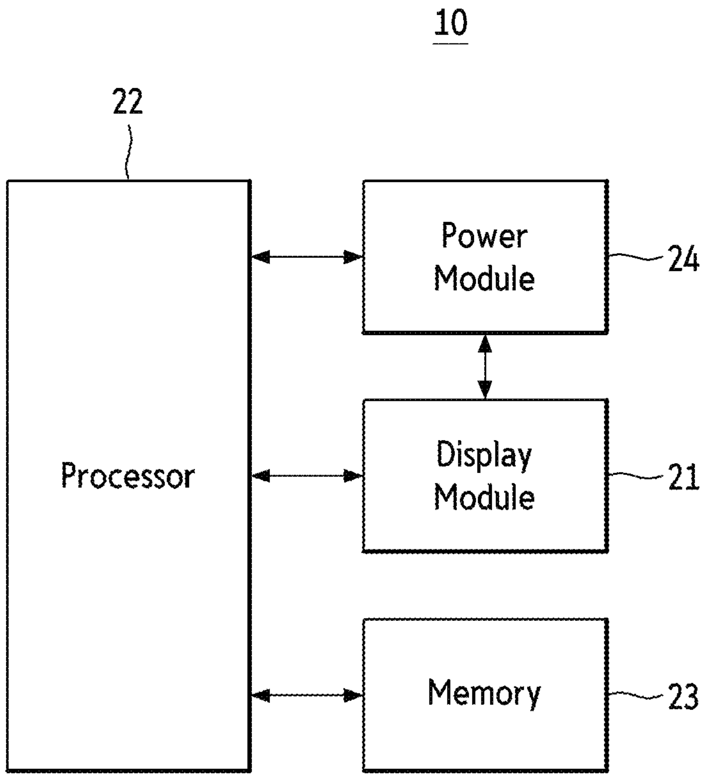
FIG. 27 is a block diagram of an electronic device according to one or more embodiments of the present disclosure.

FIG. 27 is a block diagram of an electronic device according to one or more embodiments of the present disclosure.

Referring to FIG. 27, the electronic device 1 according to one or more embodiments of the present disclosure may include a display module 21, a processor 22, a memory 23, and a power module 24.

The processor 22 may include at least one of a central processing unit (CPU), an application processor (AP), a graphic processing unit (GPU), a communication processor (CP), an image signal processor (ISP), and a controller.

The memory 23 may store data information necessary for the operation of the processor 22 or the display module 21. When the processor 22 executes an application stored in the memory 23, an image data signal and/or an input control signal is transmitted to the display module 21, and the display module 21 can process the received signal and output image information through a display screen.

The power module 24 may include a power supply module such as, for example a power adapter or a battery, and a power conversion module that converts the power supplied by the power supply module to generate power necessary for the operation of the electronic device 1.

At least one of the components of the electronic device 1 according to the one or more embodiments of the present disclosure may be included in the display device 10 according to the embodiments of the present disclosure. In addition, some modules of the individual modules functionally included in one module may be included in the display device 10, and other modules may be provided separately from the display device 10. For example, the display device 10 may include the display module 21, and the processor 22, the memory 23, and the power module 24 may be provided in the form of other devices within the electronic device 1 other than the display device 10.

Figure 28:
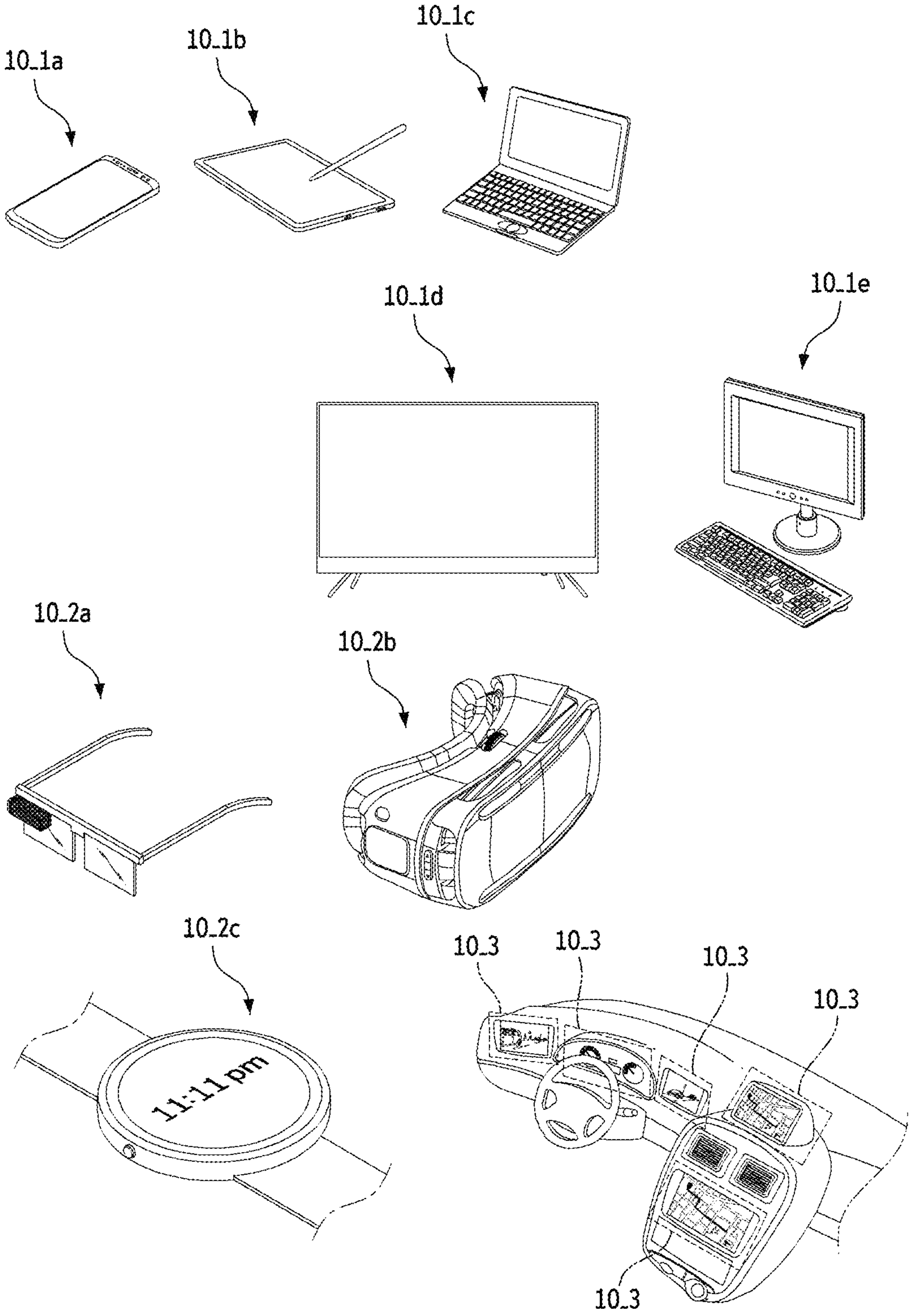
FIG. 28 is a schematic diagram of an electronic device according to various embodiments of the present disclosure.

FIG. 28 is a schematic diagram of an electronic device according to various embodiments of the present disclosure.

Referring to FIG. 28, various electronic devices to which display devices 10 according to embodiments of the present disclosure are applied may include not only image display electronic devices, such as a smart phone 10_1*a*, a tablet PC (personal computer) 10_1*b*, a laptop 10_1*c*, a TV 10_1*d*, and a desk monitor 10_1*e*, but also wearable electronic devices including display modules such as, for example smart glasses 10_2*a*, a head mounted display 10_2*b*, and a smart watch 10_2*c*, and vehicle electronic devices 10_3 including display modules, such as a CID (Center Information Display) and a room mirror display arranged on a dashboard, center fascia, and dashboard of an automobile.

However, the aspects of the present disclosure are not restricted to the one set forth herein. The above and other aspects of the present disclosure will become more apparent to one of daily skill in the art to which the present disclosure pertains by referencing the claims, with functional equivalents thereof to be included therein.

What is claimed is:

1. A display device comprising:

a display panel configured to emit light for displaying an image, and comprising:

non-folding areas for maintaining a planar shape;

at least one folding area between the non-folding areas, and configured to be transformed between a bent shape and a planar shape;

a substrate comprising a display area in which emission areas are arranged, and a non-display area around the display area;

an element layer comprising light-emitting elements in the emission areas; and a circuit layer between the element layer and the substrate, and comprising:

light-emitting pixel drivers respectively electrically connected to the light-emitting elements;

gate lines for transmitting gate signals to the light-emitting pixel drivers; and a gate-driving circuit comprising stages electrically connected to the gate lines and comprising a first buffer transistor and a second buffer transistor connected in series between a first gate level voltage line and a second gate level voltage line, wherein the first buffer transistor and the second buffer transistor comprise a channel portion, a first electrode portion connected to one side of the channel portion, a second electrode portion connected to another side of the channel portion, and a gate electrode overlapping the channel portion above an insulating layer covering the channel portion, and wherein the channel portion in the at least one folding area has a comb shape of one or more slits extending in parallel in a direction in which the first electrode portion and the second electrode portion face each other.

2. The display device of claim 1, wherein the channel portion in the at least one folding area comprises two or more splits at respective sides of the one or more slits, and wherein a width of the two or more splits is greater than a width of the one or more slits.

3. The display device of claim 2, wherein a part of the display area overlaps the at least one folding area, and wherein a part of the non-display area overlaps the at least one folding area.

4. The display device of claim 2, wherein the at least one folding area is configured to be transformed by in-folding or out-folding.

5. The display device of claim 1, wherein the stages further comprise:

a first buffer input electrode electrically connected to the first gate level voltage line and to the first electrode portion of the first buffer transistor;

a second buffer input electrode electrically connected to the second gate level voltage line and to the first electrode portion of the second buffer transistor; and a buffer output electrode electrically connected between at least one of the gate lines and the second electrode portion of the first buffer transistor and the second electrode portion of the second buffer transistor, wherein the first buffer input electrode, the second buffer input electrode, and the buffer output electrode in the at least one folding area has a mesh shape of two or more through grooves arranged in parallel.

6. The display device of claim 5, wherein the channel portion in the non-folding areas has a planar shape other than the comb shape, and wherein the first buffer input electrode, the second buffer input electrode, and the buffer output electrode in the non-folding areas has a planar shape other than the mesh shape.

7. The display device of claim 5, wherein the channel portion in the non-folding areas has the comb shape, and wherein the first buffer input electrode, the second buffer input electrode, and the buffer output electrode in the non-folding areas has the mesh shape.

8. The display device of claim 5, wherein the circuit layer further comprises:

a first semiconductor layer above the substrate;

a first gate-insulating layer covering the first semiconductor layer;

a first gate conductive layer above the first gate-insulating layer;

a second gate-insulating layer covering the first gate conductive layer;

a second gate conductive layer above the second gate-insulating layer; and a first interlayer insulating layer covering the second gate conductive layer, wherein the channel portion, the first electrode portion, and the second electrode portion are in the first semiconductor layer, and wherein the gate electrode is in the first gate conductive layer.

9. The display device of claim 8, wherein the circuit layer further comprises:

a second semiconductor layer above the first interlayer insulating layer;

a third gate-insulating layer covering the second semiconductor layer;

a third gate conductive layer above the third gate-insulating layer;

a second interlayer insulating layer covering the third gate conductive layer;

a first source-drain conductive layer above the second interlayer insulating layer;

a first planarization layer covering the first source-drain conductive layer;

a second source-drain conductive layer above the first planarization layer; and a second planarization layer covering the second source-drain conductive layer, and wherein the first buffer input electrode, the second buffer input electrode, and the buffer output electrode are in the first source-drain conductive layer or the second source-drain conductive layer.

10. The display device of claim 9, wherein one of the light-emitting pixel drivers comprises:

a first transistor electrically connected between a first node and a second node;

a pixel capacitor electrically connected between a first power line and a third node;

a second transistor electrically connected between a data line for transmitting a data signal and the first node;

a third transistor electrically connected between the second node and the third node;

a fourth transistor electrically connected between a gate initialization voltage line for transmitting a gate initialization voltage and the third node;

a fifth transistor electrically connected between the first power line and the first node;

a sixth transistor electrically connected between the second node and a fourth node;

a seventh transistor electrically connected between an anode initialization voltage line for transmitting an anode initialization voltage and the fourth node; and an eighth transistor electrically connected between a bias voltage line for transmitting a bias voltage and the first node, wherein the first node is electrically connected to a first electrode of the first transistor, wherein the second node is electrically connected to a second electrode of the first transistor, wherein the third node is electrically connected to a gate electrode of the first transistor, wherein the fourth node is electrically connected to one of the light-emitting elements, wherein the first transistor, the second transistor, the fifth transistor, the sixth transistor, the seventh transistor, and the eighth transistor comprise a channel portion, a first electrode portion, and a second electrode portion in the first semiconductor layer, and wherein the third transistor and the fourth transistor comprise a channel portion, a first electrode portion, and a second electrode portion in the second semiconductor layer.

11. The display device of claim 10, wherein the gate lines comprise:

scan write lines for transmitting a scan write signal;

scan initialization lines for transmitting a scan initialization signal;

gate control lines for transmitting a gate control signal;

emission control lines for transmitting an emission control signal; and bias control lines for transmitting a bias control signal, wherein the second transistor is configured to be turned on by the scan write signal, wherein the third transistor is configured to be turned on by the gate control signal, wherein the fourth transistor is configured to be turned on by the scan initialization signal, wherein the fifth transistor and the sixth transistor are configured to be turned on by the emission control signal, and wherein the seventh transistor and the eighth transistor are configured to be turned on by the bias control signal.

12. An electronic device comprising:

a lower cover;

a cover window above the lower cover; and a display device for displaying an image between the lower cover and the cover window, and comprising a display panel configured to emit light for displaying an image, the display panel comprising:

non-folding areas maintaining a planar shape;

at least one folding area between the non-folding areas, and configured to transform between a bent shape and a planar shape;

a substrate comprising a display area in which emission areas are arranged, and a non-display area around the display area;

an element layer comprising light-emitting elements in the emission areas above the substrate; and a circuit layer between the element layer and the substrate, and comprising:

light-emitting pixel drivers respectively electrically connected to the light-emitting elements;

gate lines for transmitting gate signals to the light-emitting pixel drivers; and a gate-driving circuit comprising stages electrically connected to the gate lines, the stages comprising:

a first buffer transistor and a second buffer transistor connected in series between a first gate level voltage line and a second gate level voltage line;

a first buffer input electrode electrically connected to the first gate level voltage line and a first electrode portion of the first buffer transistor;

a second buffer input electrode electrically connected to the second gate level voltage line and a first electrode portion of the second buffer transistor; and a buffer output electrode electrically connected between at least one of the gate lines and a second electrode portion of the first buffer transistor and a second electrode portion of the second buffer transistor, wherein the gate lines are electrically connected to the buffer output electrodes, and wherein the first buffer input electrode, the second buffer input electrode, and the buffer output electrode in the at least one folding area has a mesh shape of two or more through grooves arranged in parallel.

13. The electronic device of claim 12, wherein the first buffer transistor and the second buffer transistor comprises a channel portion, a first electrode portion connected to one side of the channel portion, a second electrode portion connected to another side of the channel portion, and a gate electrode overlapping the channel portion above an insulating layer covering the channel portion, and wherein the channel portion of the first buffer transistor and the second buffer transistor in the at least one folding area has a comb shape of one or more slits extending in parallel in a direction in which the first electrode portion and the second electrode portion face each other.

14. The electronic device of claim 13, wherein the channel portion in the at least one folding area comprises two or more splits at respective sides of the one or more slits, and wherein a width of the two or more splits is greater than a width of the one or more slits.

15. The electronic device of claim 13, wherein the channel portion in the non-folding areas has a planar shape other than the comb shape, and wherein the first buffer input electrode, the second buffer input electrode, and the buffer output electrode in the non-folding areas has a planar shape other than the mesh shape.

16. The electronic device of claim 13, wherein the channel portion in the non-folding areas has the comb shape, and wherein the first buffer input electrode, the second buffer input electrode, and the buffer output electrode in the non-folding areas has the mesh shape.

17. The electronic device of claim 13, wherein the circuit layer further comprises:

a first semiconductor layer above the substrate;

a first gate-insulating layer covering the first semiconductor layer;

a first gate conductive layer above the first gate-insulating layer;

a second gate-insulating layer covering the first gate conductive layer;

a second gate conductive layer above the second gate-insulating layer;

a first interlayer insulating layer covering the second gate conductive layer;

a second semiconductor layer above the first interlayer insulating layer;

a third gate-insulating layer covering the second semiconductor layer;

a third gate conductive layer above the third gate-insulating layer;

a second interlayer insulating layer covering the third gate conductive layer;

a first source-drain conductive layer above the second interlayer insulating layer;

a first planarization layer covering the first source-drain conductive layer;

a second source-drain conductive layer above the first planarization layer; and a second planarization layer covering the second source-drain conductive layer, and wherein the first buffer input electrode, the second buffer input electrode, and the buffer output electrode are in the first source-drain conductive layer or the second source-drain conductive layer.

18. The electronic device of claim 17, wherein the gate electrode is in the first gate conductive layer.

19. The electronic device of claim 17, wherein the gate lines comprise:

scan write lines for transmitting a scan write signal;

scan initialization lines for transmitting a scan initialization signal;

gate control lines for transmitting a gate control signal;

emission control lines for transmitting an emission control signal; and bias control lines for transmitting a bias control signal.

20. The electronic device of claim 19, wherein one of the light-emitting pixel drivers comprises:

a first transistor electrically connected between a first node and a second node;

a pixel capacitor electrically connected between a first power line and a third node;

a second transistor electrically connected between a data line for transmitting a data signal and the first node;

a third transistor electrically connected between the second node and the third node;

a fourth transistor electrically connected between a gate initialization voltage line for transmitting a gate initialization voltage and the third node;

a fifth transistor electrically connected between the first power line and the first node;

a sixth transistor electrically connected between the second node and a fourth node;

a seventh transistor electrically connected between an anode initialization voltage line for transmitting an anode initialization voltage and the fourth node; and an eighth transistor electrically connected between a bias voltage line for transmitting a bias voltage and the first node, wherein the first node is electrically connected to a first electrode of the first transistor, wherein the second node is electrically connected to a second electrode of the first transistor, wherein the third node is electrically connected to a gate electrode of the first transistor, wherein the fourth node is electrically connected to one of the light-emitting elements, wherein the first transistor, the second transistor, the fifth transistor, the sixth transistor, the seventh transistor, and the eighth transistor comprise a channel portion, a first electrode portion, and a second electrode portion in the first semiconductor layer, wherein the third transistor and the fourth transistor comprise a channel portion, a first electrode portion, and a second electrode portion in the second semiconductor layer, wherein the second transistor is configured to be turned on by the scan write signal, wherein the third transistor is configured to be turned on by the gate control signal, wherein the fourth transistor is configured to be turned on by the scan initialization signal, wherein the fifth transistor and the sixth transistor are configured to be turned on by the emission control signal, and wherein the seventh transistor and the eighth transistor are configured to be turned on by the bias control signal.

* * * * *